(12) United States Patent
Mouri et al.

(10) Patent No.: US 11,139,182 B2
(45) Date of Patent: Oct. 5, 2021

(54) SUBSTRATE PROCESSING APPARATUS AND SUBSTRATE PROCESSING METHOD

(71) Applicant: Tokyo Electron Limited, Tokyo (JP)

(72) Inventors: Nobuhiko Mouri, Kumamoto (JP); Takanori Obaru, Kumamoto (JP); Yasushi Takiguchi, Kumamoto (JP); Teruhiko Kodama, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 147 days.

(21) Appl. No.: 16/214,501

(22) Filed: Dec. 10, 2018

(65) Prior Publication Data

US 2019/0181022 A1 Jun. 13, 2019

(30) Foreign Application Priority Data

Dec. 13, 2017 (JP) .............................. JP2017-239072
Oct. 19, 2018 (JP) .............................. JP2018-197918

(51) Int. Cl.

| | |
|---|---|
| *H01L 21/67* | (2006.01) |
| *H01L 21/687* | (2006.01) |
| *B08B 1/04* | (2006.01) |
| *B08B 1/00* | (2006.01) |
| *H01L 21/304* | (2006.01) |

(Continued)

(52) U.S. Cl.
CPC ........ *H01L 21/67046* (2013.01); *B08B 1/001* (2013.01); *B08B 1/04* (2013.01); *B24B 37/107* (2013.01); *B24B 37/30* (2013.01); *H01L 21/304* (2013.01); *H01L 21/67028* (2013.01); *H01L 21/67051* (2013.01); *H01L 21/67748* (2013.01);

(Continued)

(58) Field of Classification Search
CPC ......... H01L 21/67046; H01L 21/67051; H01L 21/304; B24B 37/30; B24B 37/107
See application file for complete search history.

(56) References Cited

U.S. PATENT DOCUMENTS 5,651,160 A * 7/1997 Yonemizu ............... B08B 1/007
15/302
5,675,856 A * 10/1997 Itzkowitz .................. B08B 1/04
15/77

(Continued)

FOREIGN PATENT DOCUMENTS

JP 2010-109225 A 5/2010

*Primary Examiner* — Natasha N Campbell
(74) *Attorney, Agent, or Firm* — Abelman, Frayne & Schwab

(57) ABSTRACT

A substrate processing apparatus includes a substrate holder, a first cleaning body, a first moving mechanism, a second cleaning body, a second moving mechanism, and a controller. The first cleaning body cleans one of the upper surface and the lower surface of the substrate held by the substrate holder by ejecting fluid thereto or by coming into contact therewith. The second cleaning body cleans the other one of the upper surface and the lower surface of the substrate held by the substrate holder by coming into contact therewith. The controller controls the first moving mechanism and the second moving mechanism to perform a both-surface cleaning processing in which the first cleaning body which ejects the fluid to one surface or is in contact with the upper surface and the second cleaning body which is in contact with the lower surface are horizontally moved in synchronization with each other.

12 Claims, 20 Drawing Sheets

(51) Int. Cl.
*H01L 21/677* (2006.01)
*B24B 37/30* (2012.01)
*B24B 37/10* (2012.01)

(52) U.S. Cl.
CPC .. *H01L 21/68728* (2013.01); *H01L 21/68742* (2013.01)

(56) References Cited

U.S. PATENT DOCUMENTS

| | | | |
|---|---|---|---|
| 6,175,983 B1* | 1/2001 | Hirose | B08B 1/007 |
| | | | 15/102 |
| 2001/0010103 A1* | 8/2001 | Konishi | H01L 21/67051 |
| | | | 15/77 |
| 2008/0163899 A1* | 7/2008 | Takiguchi | H01L 21/67051 |
| | | | 134/30 |
| 2009/0126761 A1* | 5/2009 | Orhii | H01L 21/67046 |
| | | | 134/6 |
| 2015/0133032 A1* | 5/2015 | Kubo | B24B 47/16 |
| | | | 451/5 |
| 2015/0255316 A1* | 9/2015 | Dobashi | H01L 21/0209 |
| | | | 134/37 |

* cited by examiner

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2017-239072 and 2018-197918 filed on Dec. 13, 2017 and Oct. 19, 2018, respectively, with the Japan Patent Office, the disclosures of which are incorporated herein in their entirety by reference.

TECHNICAL FIELD

Exemplary embodiments described herein relate generally to a substrate processing apparatus and a substrate processing method.

BACKGROUND

In the related art, a substrate processing apparatus for physically cleaning a substrate using, for example, a brush or sponge is known. For example, Japanese Patent Laid-Open Publication No. 2010-109225 discloses a substrate processing apparatus provided with a brush that cleans the upper surface of a substrate.

SUMMARY

A substrate processing apparatus according to an aspect of an embodiment includes a substrate holder, a first cleaning body, a first moving mechanism, a second cleaning body, a second moving mechanism, and a controller. The substrate holder holds a substrate. The first cleaning body cleans one of an upper surface and a lower surface of the substrate held by the substrate holder by ejecting fluid thereto or by coming into contact therewith. The first moving mechanism including a first rail horizontally moves the first cleaning body. The second cleaning body cleans a remaining surface of the upper surface and the lower surface of the substrate held by the substrate holder by coming into contact therewith. The second moving mechanism including a second rail horizontally moves the second cleaning body. The controller controls the first moving mechanism and the second moving mechanism to perform a both-surface cleaning processing in which the first cleaning body which ejects the fluid to one surface or is in contact with the upper surface and the second cleaning body which is in contact with the lower surface are horizontally moved in synchronization with each other.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
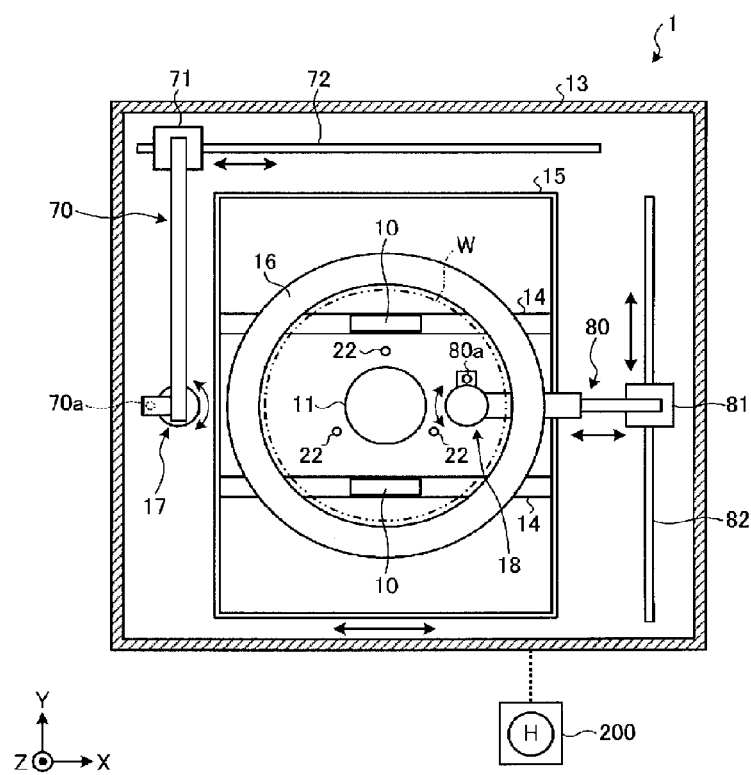
FIG. 1 is a plan view illustrating a configuration of a substrate processing apparatus according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the related art, since the substrate is bent in a direction to escape from the brush by pressing the brush against the substrate, it is difficult to apply a strong force to the substrate. For this reason, it is difficult to strongly clean a substrate in the related art.

An object of an embodiment provides a substrate processing apparatus and a substrate processing method capable of strongly cleaning a substrate.

A substrate processing apparatus according to an aspect of an embodiment includes a substrate holder, a first cleaning body, a first moving mechanism, a second cleaning body, a second moving mechanism, and a controller. The substrate holder holds a substrate. The first cleaning body cleans one of an upper surface and a lower surface of the substrate held by the substrate holder by ejecting fluid thereto or by coming into contact therewith. The first moving mechanism including a first rail horizontally moves the first cleaning body. The second cleaning body cleans a remaining surface of the upper surface and the lower surface of the substrate held by the substrate holder by coming into contact therewith. The second moving mechanism including a second rail horizontally moves the second cleaning body. The controller controls the first moving mechanism and the second moving mechanism to perform a both-surface cleaning processing in which the first cleaning body which ejects the fluid to one surface or is in contact with the upper surface and the second cleaning body which is in contact with the lower surface are horizontally moved in synchronization with each other.

In the above-described substrate processing apparatus, the first cleaning body cleans the one surface by ejecting the fluid thereto, and in the both-surfaces cleaning processing, the controller controls the first moving mechanism and the second moving mechanism to horizontally move the first cleaning body and the second cleaning body in a direction where the first cleaning body and the second cleaning body are separated away from each other.

In the above-described substrate processing apparatus, the substrate holder includes: a rotatable first substrate holder configured to suck and hold a first area including a central portion of the lower surface of the substrate; and a second substrate holder configured to suck and hold a second area which is an area other than the first area on the lower surface of the substrate. The controller is configured to control the second moving mechanism in a state where the substrate is sucked and held by the second substrate holder so as to execute the both-surface cleaning processing by bringing the second cleaning body into contact with the second area in a state where the substrate is sucked, hold, and rotated by the first substrate holder after a lower surface cleaning processing is executed in which the second cleaning body is brought into contact with the first area and the first area is horizontally moved.

In the above-described substrate processing apparatus, the first cleaning body cleans the upper surface of the substrate by coming into contact therewith, and the second cleaning body cleans the lower surface of the substrate by coming into contact therewith.

In the above-described substrate processing apparatus, the controller is configured to execute a processing of horizontally moving the first cleaning body and the second cleaning body while maintaining a state where a contact surface of the first cleaning body with the upper surface and a contact surface of the first cleaning body with the upper surface overlap each other when the substrate held by the substrate holder is viewed in a thickness direction in a plan view, as the both-surface cleaning processing.

The above-described substrate processing apparatus further includes: a first driver configured to rotate the first cleaning body around a vertical axis; and a second driver configured to rotate the second cleaning body around a vertical axis. The controller is configured to execute a processing of horizontally moving the first cleaning body and the second cleaning body in a state where a center of rotation of the first cleaning body by the first driver and a center of rotation of the second cleaning body by the second driver are made to coincide with each other, as the both-surface cleaning processing.

In the above-described substrate processing apparatus, the first moving mechanism is configured to move up and down the first cleaning body, the second moving mechanism is configured to move up and down the second cleaning body, and the controller is configured to control at least one of the first moving mechanism and the second moving mechanism such that a pressing force of the first cleaning body against the upper surface and a pressing force of the second cleaning body against the lower surface have a same magnitude in the both-surface cleaning processing.

The above-described substrate processing apparatus further includes: a load detector configured to detect the pressing force of the first cleaning body against the upper surface or the pressing force of the second cleaning body against the lower surface. The controller is configured to arrange one of the first cleaning body and the second cleaning body at a predetermined height position, and to adjust a height position of a remaining one of the first cleaning body and the second cleaning body based on a detection result.

In the above-described substrate processing apparatus, one of the upper surface and the lower surface is a circuit forming surface, and a contact surface with the substrate in one cleaning body, which comes into contact with the circuit forming surface, among the first cleaning body and the second cleaning body is larger than a contact surface with the substrate in a remaining cleaning body.

In the above-described substrate processing apparatus, one of the upper surface and the lower surface is a circuit forming surface, and of the first cleaning body and the second cleaning body, one cleaning body, which comes into contact with the circuit forming surface, is softer than a remaining cleaning body.

In the above-described substrate processing apparatus, the substrate holder includes: a rotatable first substrate holder configured to suck and hold a first area including a central portion of the lower surface of the substrate; and a second substrate holder configured to suck and hold a second area which is an area other than the first area on the lower surface of the substrate. The controller is configured to control the second moving mechanism in a state where the substrate is sucked and held by the second substrate holder so as to execute the both-surface cleaning processing by bringing the second cleaning body into contact with the second area in a state where the substrate is sucked, hold, and rotated by the first substrate holder after a lower surface cleaning processing is executed in which the second cleaning body is brought into contact with the first area and the first area is horizontally moved.

A substrate processing method according to an aspect of an embodiment includes: holding a substrate by a substrate holder; and cleaning both an upper surface and a lower surface of the substrate by horizontally moving a first cleaning body and a second cleaning body in synchronization in a state where the first cleaning body, configured to clean one surface of an upper surface and a lower surface of the substrate by ejecting a fluid there to or by coming into contact therewith, is caused to eject the fluid to the one surface or brought into contact with the one surface, and the second cleaning body, configured to clean remaining surface of the upper surface and the lower surface of the substrate by coming into contact therewith, is brought into contact with the remaining surface.

According to the aspect of the embodiment, it is possible to strongly clean a substrate.

Hereinafter, modes (hereinafter, referred to as "embodiments") for implementing a substrate processing apparatus and a substrate processing method according to the present application will be described in detail with reference to the drawings. Herein, the substrate processing apparatus and the substrate processing method according to the present application are not limited by these embodiments. In addition, respective embodiments may be appropriately combined within a range not inconsistent with processing contents. Further, in each of the following embodiments, the same components are denoted by the same reference numerals, and duplicate descriptions are omitted.

First Embodiment

Figure 2:
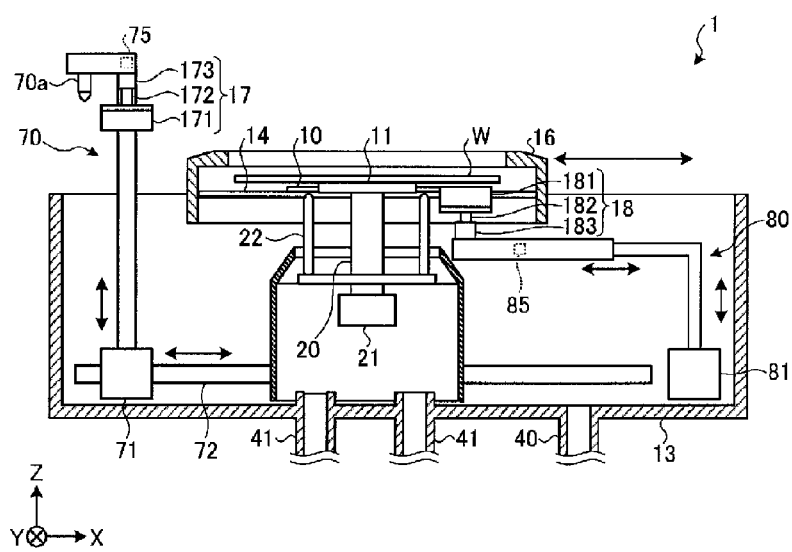
FIG. 2 is a vertical sectional view illustrating the configuration of the substrate processing apparatus according to the first embodiment.

First, the configuration of a substrate processing apparatus 1 according to a first embodiment will be described with reference to FIGS. 1 and 2. FIG. 1 is a plan view illustrating the configuration of a substrate processing apparatus according to a first embodiment. FIG. 2 is a vertical sectional view illustrating the configuration of the substrate processing apparatus according to the first embodiment. In the following description, in order to clarify a positional relationship, an X axis, a Y axis, and a Z axis orthogonal to each other are defined, and the Z-axis positive direction is defined as a vertical upward direction.

The substrate processing apparatus 1 includes two suction pads 10 configured to horizontally suck and hold the lower surface of a substrate such as, for example, a semiconductor wafer or a glass substrate (hereinafter, referred to as a "wafer W"), a spin chuck 11 configured to horizontally suck and hold the lower surface of the wafer W received from the suction pads 10, a first cleaning unit 17 configured to perform a cleaning processing on the upper surface of the wafer W, a second cleaning unit 18 configured to perform a cleaning processing on the lower surface of the wafer W.

A circuit is formed on at least one of the upper surface and the lower surface of the wafer W. Here, it is assumed that a circuit is formed on the upper surface of the wafer W.

As illustrated in FIG. 1, the two suction pads 10 are formed in an elongated substantially rectangular shape, and are provided substantially in parallel with the spin chuck 11 interposed therebetween so as to be able to hold the peripheral edge portion of the lower surface of the wafer W. Each suction pad 10 is supported by a substantially rectangular support plate 14 longer than the suction pad 10. Both ends of the support plate 14 are supported by a frame 15 freely movable in a horizontal direction (X-axis direction in FIG. 1) and a vertical direction (Z-axis direction in FIG. 1) by a drive mechanism (not illustrated).

An upper cup 16 is provided on the upper surface of the frame 15. An opening having a diameter larger than the diameter of the wafer W is formed on the upper surface of the upper cup 16, and the wafer is delivered between a transport mechanism provided outside the substrate processing apparatus 1 and the suction pads 10 via this opening.

As illustrated in FIG. 2, the spin chuck 11 is connected to a drive mechanism 21 via the shaft 20. The spin chuck 11 is rotatable and vertically movable by the drive mechanism 21.

For example, three lifting pins 22 are provided around the spin chuck 11 so as to be movable up and down by a lifting mechanism (not illustrated). As a result, the wafer W may be delivered between the lifting pins 22 and the transport mechanism (not illustrated) provided outside the substrate processing apparatus 1.

At the bottom of the housing 13, a drain pipe 40 that discharges cleaning liquid and an exhaust pipe 41 that forms a downward air flow in the substrate processing apparatus 1 and exhausts the air flow are provided.

Next, the configurations of the first cleaning unit 17 and the second cleaning unit 18 will be described. As illustrated in FIG. 2, the first cleaning unit 17 includes a first cleaning body 171, a first support post member 172, and a first drive unit 173.

The first cleaning body 171 is a member that is pressed against the upper surface of the wafer W. The first cleaning body 171 is, for example, a brush composed of a large number of tufts of bristles. The lower surface of the first cleaning body 171, that is, the contact surface with the wafer W has, for example, a circular shape smaller than the upper surface of the wafer W. The first cleaning body 171 may be sponge.

On the upper surface of the first cleaning body 171, a first support post member 172 is provided. The first support post member 172 extends in the vertical direction (Z-axis direction), and supports the first cleaning body 171 at one end portion thereof.

A first drive unit 173 is provided at the other end portion of the first support post member 172. The first drive unit 173 rotates the first support post member 172 around the vertical axis. As a result, the first cleaning body 171 supported on the first support post member 172 is capable of being rotated about the vertical axis.

The first cleaning unit 17 is horizontally supported by an arm 70. A cleaning nozzle 70a is provided adjacent to the first cleaning unit 17 on the arm 70 so as to supply a cleaning fluid to the upper surface of the wafer W held by the spin chuck 11. As the cleaning fluid, for example, pure water is used.

The arm 70 is provided with a load detection unit 75 that detects the pressing force of the first cleaning body 171 against the wafer W. The load detection unit 75 is, for example, a load cell.

The arm 70 is connected to a moving unit 71. The moving unit 71 horizontally moves the arm 70 along a rail 72 extending in a horizontal direction (here, the X-axis direction). Further, the moving unit 71 moves up and down the arm 70 in the vertical direction (Z-axis direction).

The second cleaning unit 18 includes a second cleaning body 181, a second support post member 182, and a second drive unit 183.

The second cleaning body 181 is a member that is pressed against the lower surface of the wafer W. The second cleaning body 181 is, for example, a brush composed of a large number of tufts of bristles. The upper surface of the second cleaning body 181, that is, the contact surface with the wafer W has, for example, a circular shape smaller than the upper surface of the wafer W. The second cleaning body 181 may be sponge.

On the lower surface of the first cleaning body 181, a second support post member 182 is provided. The second support post member 182 extends in the vertical direction (Z-axis direction), and supports the second cleaning body 181 at one end portion thereof.

A second drive unit 183 is provided at the other end portion of the second support post member 182. The second drive unit 183 rotates the second support post member 182 around the vertical axis. As a result, the second cleaning body 181 supported on the second support post member 182 is capable of being rotated about the vertical axis.

The second cleaning unit 18 is horizontally supported by an arm 80. A cleaning nozzle 80a is provided adjacent to the second cleaning body 181 on the arm 80 so as to supply a cleaning fluid to the lower surface of the wafer W held by the suction pads 10 or the spin chuck 11. As the cleaning fluid, for example, pure water is used.

The arm 80 is connected to a moving unit 81. The moving unit 81 horizontally moves the arm 80 along a rail 82 extending in a horizontal direction (here, the Y-axis direction). Further, the moving unit 81 moves up and down the arm 80 in the vertical direction (Z-axis direction).

The arm 80 expands and contracts in the horizontal direction (X-axis direction) by, for example, a drive unit (not illustrated). As a result, the arm 80 is capable of moving the second cleaning unit 18 and the cleaning nozzle 80a in the X-axis direction, that is, in the same direction as the moving direction of the first cleaning unit 17.

The arm 80 is provided with a load detection unit 85 that detects the pressing force of the second cleaning body 181 against the wafer W. The load detection unit 85 is, for example, a load cell.

The above-described substrate processing apparatus 1 is provided with a controller 200 as illustrated in FIG. 1. The controller 200 is, for example, a computer, and has a program storage unit (not illustrated). In the program storage unit, a program for controlling a processing of the wafer W in the substrate processing apparatus 1 is stored. In addition, the program storage unit also stores a program for controlling the operation of a drive system of, for example, the above-described various drive devices and moving devices and various nozzles so as to realize the cleaning processing in the substrate processing apparatus 1. The program is stored in a computer-readable storage medium H such as, for example, a computer-readable hard disk (HD), a flexible disk (FD), a compact disk (CD), a magnet optical disk (MO), a memory card, and may be installed in the controller 200 from the storage medium H.

Figure 3:
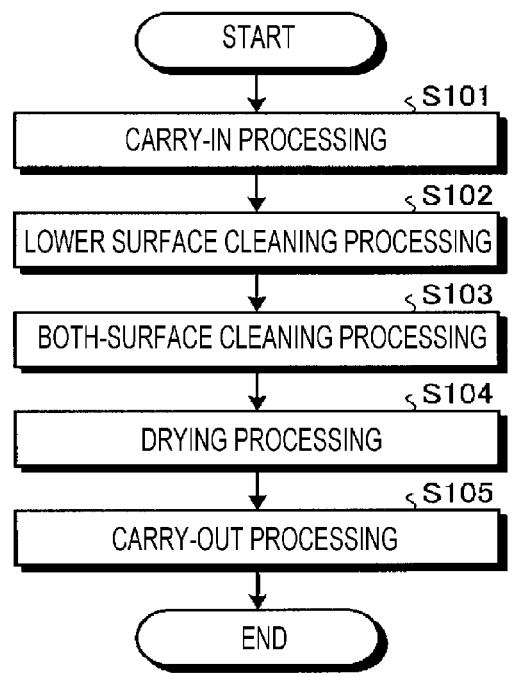
FIG. 3 is a flowchart illustrating a procedure of a cleaning processing executed by a substrate cleaning apparatus.
Figure 4:
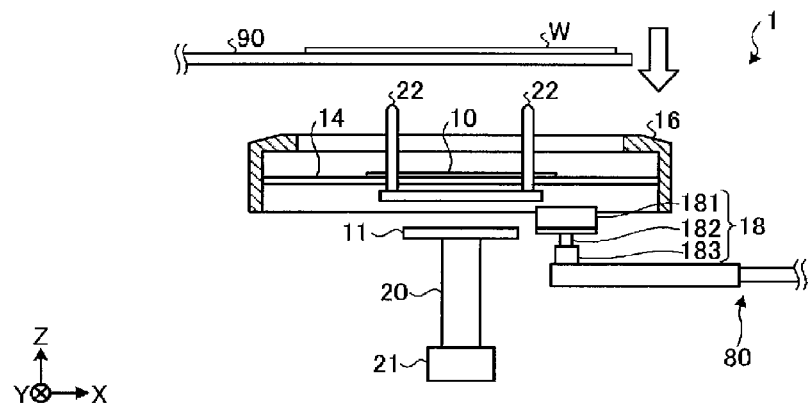
FIG. 4 is a view illustrating an operation example of a carry-in processing.
Figure 5:
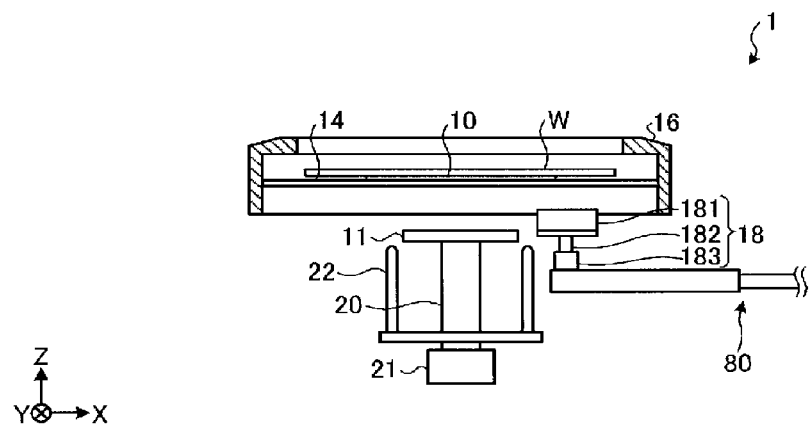
FIG. 5 is a view illustrating an operation example of a carry-in processing.
Figure 6:
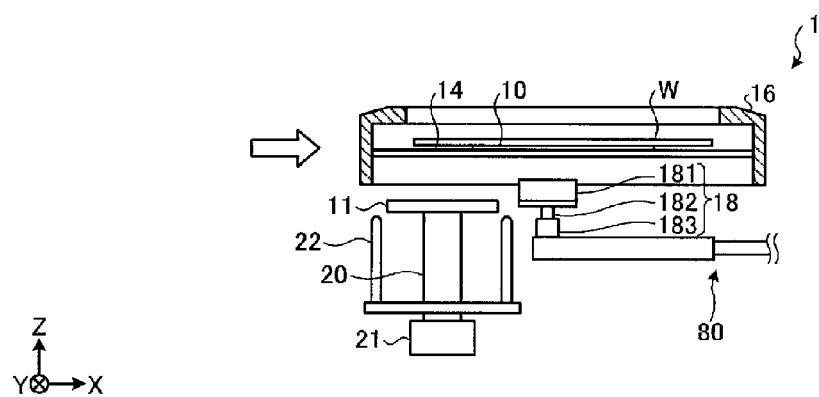
FIG. 6 is a view illustrating an operation example of a lower surface cleaning processing.

Next, a cleaning processing of a wafer W in the substrate processing apparatus 1 will be described. FIG. 3 is a flowchart showing the procedure of a series of cleaning processings performed by the substrate processing apparatus 1. FIGS. 4 and 5 are views illustrating an operation example of a carry-in processing, FIGS. 6 to 8 are views illustrating an operation example of a lower surface cleaning processing, and FIGS. 9 to 13 are views illustrating an operation example of a both-surface cleaning processing.

As illustrated in FIG. 3, in the substrate processing apparatus 1, first, a carry-in processing is performed (step S101). In the carry-in processing, as illustrated in FIG. 4, the wafer W is transported to a side above the upper cup 16 by a transport mechanism 90 provided outside the substrate processing apparatus 1. Subsequently, the lift pins 22 are raised, and the wafer W is delivered to the lift pins 22. At this time, the suction pads 10 stands by in the state where the upper surfaces of the suction pads 10 are located by at a position higher than the upper surface of the second cleaning body 181, and the upper surface of the spin chuck 11 is retracted to a position lower than the upper surface of the second cleaning body 181. Thereafter, the lift pins 22 are lowered, and as illustrated in FIG. 5, the wafer W is delivered to the suction pads 10 and sucked and held.

Subsequently, a lower surface cleaning processing is performed (step S102). In the lower surface cleaning processing, first, as illustrated in FIG. 6, the suction pads 10 holding the wafer W are moved together with the support plate 14 and the upper cup 16 in the horizontal direction (here, the X-axis direction). As a result, the spin chuck 11 is disposed at a position close to the outer peripheral portion of the wafer W, and the second cleaning unit 18 is placed at a position close to the central portion of the wafer W.

Figure 7:
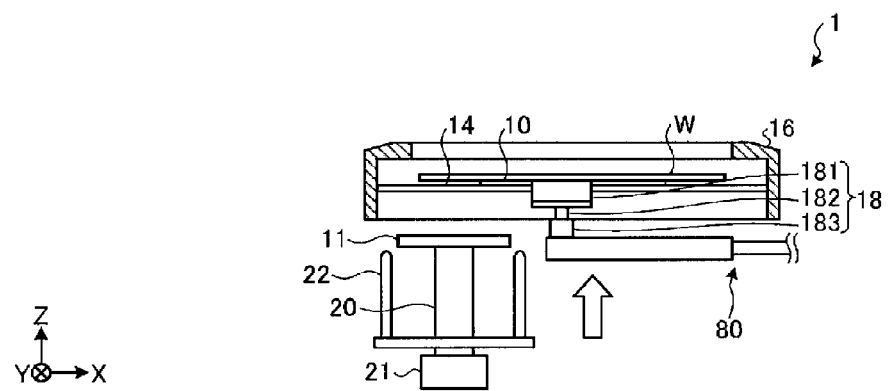
FIG. 7 is a view illustrating an operation example of a lower surface cleaning processing.
Figure 8:
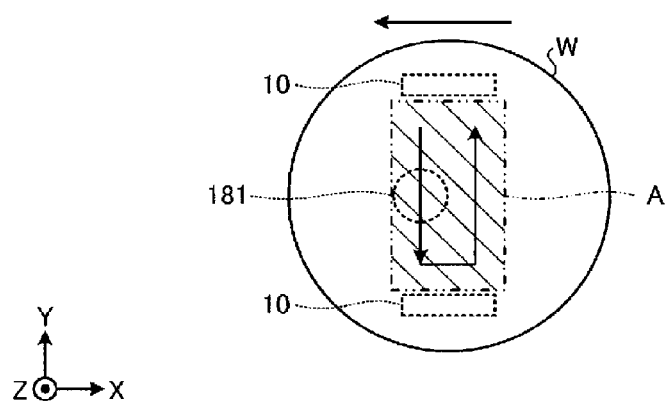
FIG. 8 is a view illustrating an operation example of a lower surface cleaning processing.

Subsequently, as illustrated in FIG. 7, the second cleaning unit 18 is raised using, for example, the moving unit 81 (see, e.g., FIG. 2) so that the second cleaning body 181 is pressed against the lower surface of the wafer W. At this time, the moving unit 81 raises the second cleaning unit 18 such that the pressing force of the second cleaning body 181 against the wafer W becomes a desired value. The distance by which the second cleaning unit 18 is raised is capable of being determined based on, for example, a detection result of the load detection unit 85. Here, although the second cleaning unit 18 is raised, the lower surface of the wafer W may be pressed against the second cleaning body 181 by lowering the suction pads 10. Further, the suction pads 10 may be lowered while raising the second cleaning unit 18.

Thereafter, supply of pure water from the cleaning nozzle 80a (see, e.g., FIG. 1) to the lower surface of the wafer W is started. Further, rotation of the second cleaning body 181 is started.

The cleaning of the lower surface of the wafer W by the second cleaning unit 18 proceeds by a combination of a movement of the wafer W by the suction pads 10 and a movement of the second cleaning unit 18 by the moving unit 81. For example, as illustrated in FIG. 8, the space between the two suction pads 10 is reciprocated in the Y-axis direction with respect to the second cleaning body 181, and when the moving direction of the second cleaning body 181 is switched, the suction pads 10 are moved in the negative X-axis direction by a distance equal to or less than the diameter of 181. As a result, the central area A of the wafer W including the area sucked and held by the spin chuck 11 is cleaned by the second cleaning body 181. Thereafter, the rotation of the second cleaning body 181 is stopped, and the supply of pure water from the cleaning nozzle 80*a* is stopped.

Figure 9:
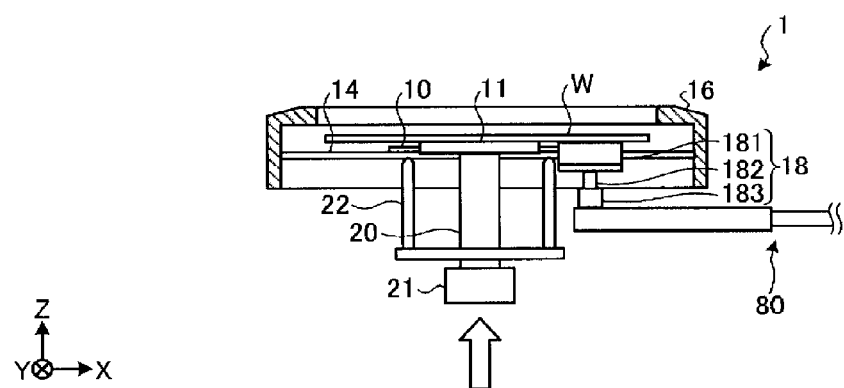
FIG. 9 is a view illustrating an operation example of a both-surface cleaning processing.

Subsequently, a both-surface cleaning processing is performed (step S103). In the both-surface cleaning processing, first, as illustrated in FIG. 9, after the suction pads 10 are moved to position the central portion of the wafer W above the spin chuck 11, suction of the wafer W by the suction pads 10 is released, and the spin chuck 11 is raised, whereby the wafer W is delivered from the suction pads 10 to the spin chuck 11.

Figure 10:
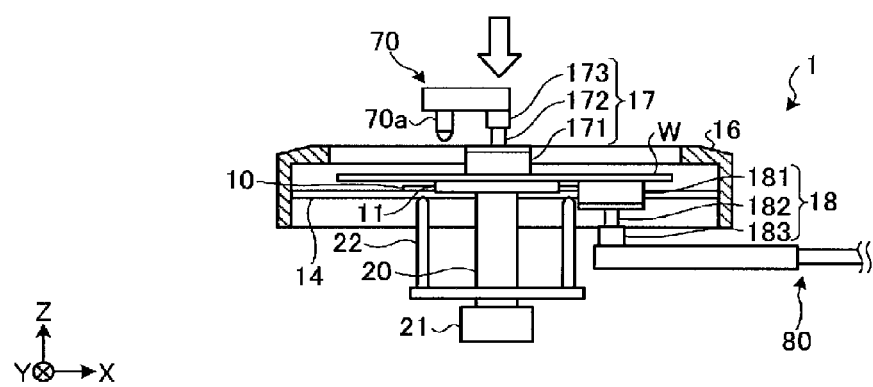
FIG. 10 is a view illustrating an operation example of a both-surface cleaning processing.

In addition, as illustrated in FIG. 10, after the first cleaning unit 17 is positioned above the center of the wafer W using the moving unit 71 (see, e.g., FIG. 2), the first cleaning unit 17 is lowered and the first cleaning body 171 is pressed against the upper surface of the wafer W. At this time, the moving unit 71 lowers the first cleaning body 171 such that the pressing force of the first cleaning body 171 against the wafer W becomes a desired value, specifically, the same as the pressing force of the second cleaning body 181 against the wafer W. The distance by which the first cleaning unit 17 is lowered may be determined based on, for example, the detection result of the load detection unit 75.

Here, both the first cleaning unit 17 and the second cleaning unit 18 are subjected to pressure control based on the detection results of the load detection units 75, 85 such that the pressing force against the wafer W becomes a desired value. However, position control may be performed to maintain the state where one of the first cleaning unit 17 and the second cleaning unit 18 is disposed at a predetermined height position without performing the pressure control with respect to the one of the first cleaning unit 17 and the second cleaning unit 18. For example, while maintaining the state where the first cleaning body 171 is disposed at a predetermined height position with respect to the first cleaning unit 17, the height position of the second cleaning unit 18 may be adjusted based on the detection result of the load detection unit 85 such that the pressing force of the second cleaning unit 18 against the wafer W becomes a desired value. Accordingly, it is possible to clean the upper surface and the lower surface of the wafer W with the same pressing force only by controlling the pressure of one of the first cleaning unit 17 and the second cleaning unit 18, and thus the adjustment of the pressing force is capable of being facilitated.

Figure 11:
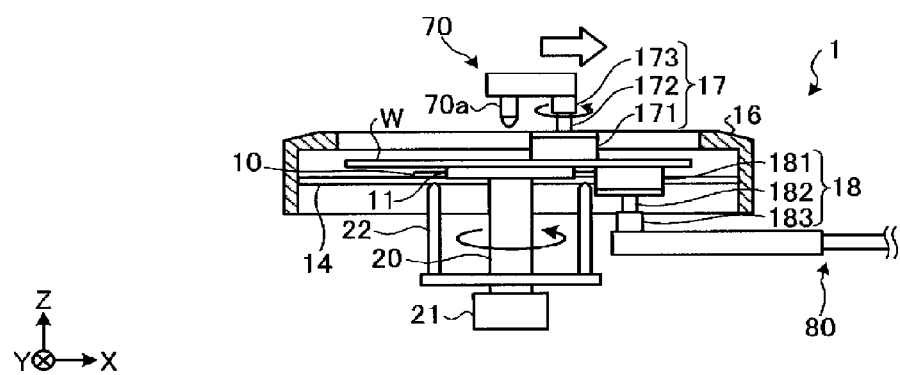
FIG. 11 is a view illustrating an operation example of a both-surface cleaning processing.

Subsequently, as illustrated in FIG. 11, the wafer W is rotated by rotating the spin chuck 11 using the drive mechanism 21. In addition, supply of pure water from the cleaning nozzle 70*a* to the upper surface of the wafer W is started, and rotation of the first cleaning body 171 is started. Then, the first cleaning body 171 is moved in the horizontal direction (X-axis positive direction) using the moving unit 71. As a result, the central area of the upper surface of the wafer W is cleaned by the first cleaning body 171. In addition, after rotating the wafer W and the first cleaning body 171, the first cleaning body 171 may be pressed against the wafer W.

It is assumed that the second cleaning body 181 is stopped at a position deviated from the center of the wafer W in the direction along the rail 72 (see, e.g., FIG. 1). That is, the second cleaning body 181 is disposed at a position overlapping the course of the first cleaning body 171 in a plan view.

Figure 12:
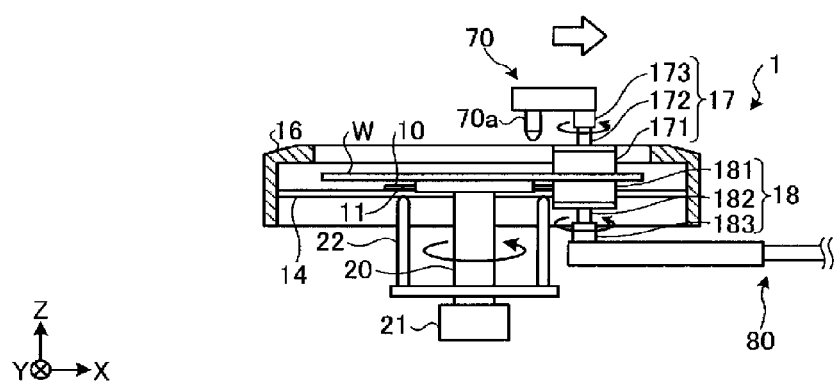
FIG. 12 is a view illustrating an operation example of a both-surface cleaning processing.
Figure 13:
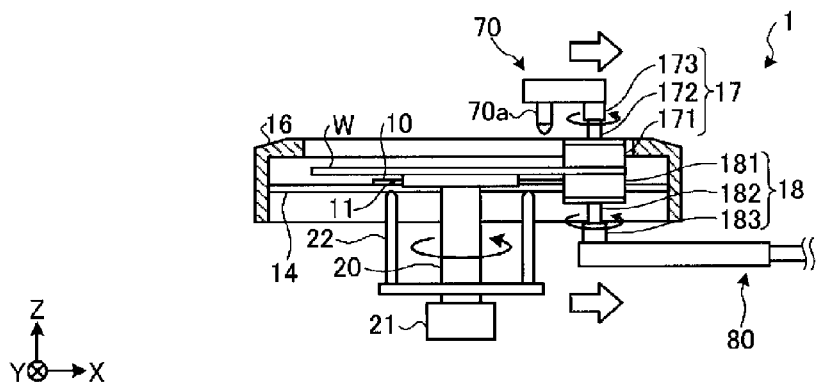
FIG. 13 is a view illustrating an operation example of a both-surface cleaning processing.

Subsequently, as illustrated in FIG. 12, when the first cleaning body 171 reaches the position where the first cleaning body 171 and the second cleaning body 181 overlap each other in a plan view, supply of pure water from the cleaning nozzle 80*a* (see, e.g., FIG. 1) to the lower surface of the wafer W is started, and rotation of the second cleaning body 181 is started. Then, as illustrated in FIG. 13, the first cleaning body 171 and the second cleaning body 181 are placed on the wafer W (wafer W) are horizontally moved in the same direction (positive X-axis direction) at the same speed toward the outer peripheral portion of the wafer W such that the state where the first cleaning body 171 and the second cleaning body 181 overlap each other in a plan view is maintained. That is, the first cleaning body 171 and the second cleaning body 181 are horizontally moved in synchronization.

While horizontally moving the first cleaning body 171 and the second cleaning body 181 in synchronization, the force of pressing the first cleaning body 171 against the wafer W is adjusted to be the same as the force of pressing the second cleaning body 181 against the wafer W. Therefore, it is possible to prevent the wafer W from being deflected downward by being pushed by the first cleaning body 171 and from being deflected upward by being pushed by the second cleaning body 181.

When the first cleaning body 171 and the second cleaning body 181 reach the outer peripheral portion of the wafer W, the rotation of the first cleaning body 171 and the second cleaning body 181 is stopped, and the supply of pure water from the cleaning nozzles 70*a*, 80*a* is stopped. Further, the first cleaning body 171 and the second cleaning body 181 are retracted from the wafer W.

In addition, the supply of pure water from the cleaning nozzle 70*a* may be stopped after the supply of pure water from the cleaning nozzle 80*a* is stopped. This makes it possible to suppress the pure water from turning around from the lower surface of the wafer W to the upper surface of the wafer W which is the circuit formation surface. However, the supply of pure water from the cleaning nozzles 70*a*, 80*a* may be stopped at the same time.

Subsequently, a drying processing is performed (step S104). In the drying processing, the spin chuck 11 is rotated at a high speed to spin off the pure water adhering to the wafer W, thereby drying the wafer W.

Thereafter, a carry-out processing is performed (step S105). In the carry-out processing, the wafer W is delivered to the transport mechanism 90 in the reverse order to the carry-in processing (step S101). As a result, a series of cleaning processings for one wafer W is completed.

As described above, the substrate processing apparatus 1 according to the first embodiment is configured such that a both-surface cleaning processing in which both the upper surface and the lower surface of the wafer W are simultaneously cleaned is performed by horizontally moving the first cleaning unit 17 and the second cleaning unit 18 in synchronization with each other.

Figure 14:
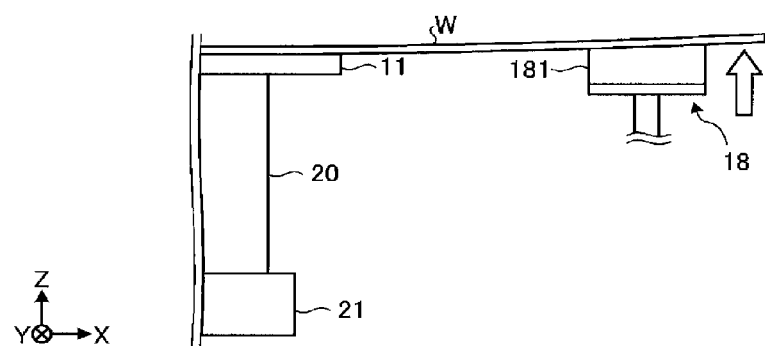
FIG. 14 is a view illustrating an example of cleaning only the lower surface of a wafer.
Figure 15:
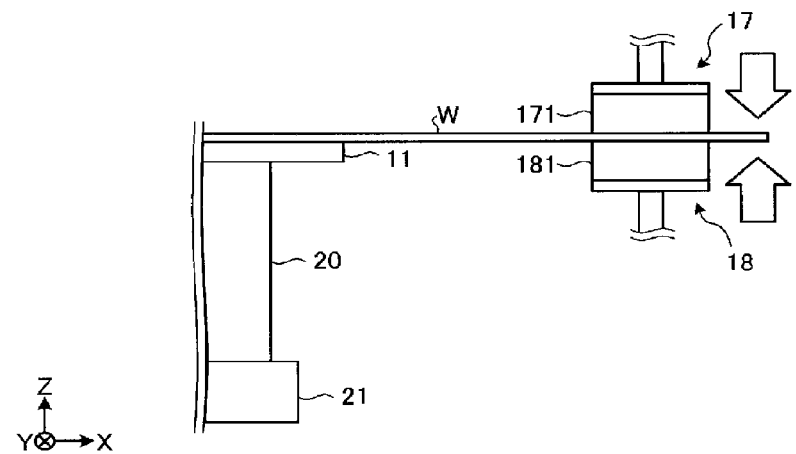
FIG. 15 is a view illustrating an example of cleaning both surfaces of a wafer simultaneously.

This makes it possible to clean the wafer W with a stronger pressing force in comparison with the case where the upper surface of the wafer W and the lower surface of the wafer W are separately cleaned. This point will be described with reference to FIGS. 14 and 15. FIG. 14 is a view illustrating an example of cleaning only the lower surface of the wafer W, and FIG. 15 is a view illustrating an example of cleaning both sides of the wafer W at the same time.

As illustrated in FIG. 14, for example, when only the lower surface of the wafer W is cleaned using the second cleaning section 18, since the wafer W is deflected in the direction where the wafer W is transferred from the second cleaning body 181 by pressing the second cleaning body 181 against the wafer W, it is difficult to apply a strong force to the wafer W. This also applies to the case where only the upper surface of the wafer W is cleaned using the first cleaning body 171.

In the case where only the lower surface of the wafer W is cleaned using the second cleaning unit 18, since an upward force is applied to the wafer W by pressing the second cleaning body 181 against the wafer W, there is a possibility that the wafer W is detached from the spin chuck 11. Therefore, the force of pressing the second cleaning body 181 is restricted by the suction force of the spin chuck 11. That is, the pressing force is limited to such an extent that the wafer W is not detached from the spin chuck 11. For this reason, it is particularly difficult to strongly clean the lower surface of the wafer W.

On the other hand, in the substrate processing apparatus 1 according to the first embodiment, the wafer W is pressed from both the upper and lower sides by sandwiching the wafer W between the first cleaning unit 17 and the second cleaning unit 18. As a result, the force of the first cleaning unit 17 pressing down the wafer W and the force of the second cleaning unit 18 pressing up the wafer W can cancel out each other. Therefore, it is possible to set the pressing forces of the first cleaning unit 17 and the second cleaning unit 18 high without deflecting the wafer W and without being restricted by the suction force of the spin chuck 11. For example, by matching the force of pressing the lower surface of the wafer W to the pressing force of the first cleaning body 171, which is determined depending on a force allowed to be applied to the upper surface of the wafer W (e.g., the pressure which does not cause a film to be excessively cut) or a force, by which the cleaning of the upper surface of the wafer W can be effectively performed, it is possible to strongly clean the lower surface of the wafer W with a pressing force stronger than the pressing force determined in consideration of restrictions imposed by the suction force of the spin chuck 11.

In this way, with the substrate processing apparatus 1 of the first embodiment, it is possible to strongly clean the wafer W in comparison with the case where only one surface of the wafer W is cleaned using a single cleaning body.

Further, with the substrate processing apparatus 1 of the first embodiment, it is possible to shorten the time required for cleaning the both sides of the wafer W by simultaneously cleaning the upper surface and the lower surface of the wafer W in comparison with, for example, the case where one surface of the wafer W is cleaned, then the front and rear surfaces of the wafer W are reversed using a reversing mechanism, and then the other surface is cleaned.

In the substrate processing apparatus 1 according to the first embodiment, for example, when the first cleaning body 171 and the second cleaning body 181 completely overlap each other in a plan view, specifically, when the rotation center of the first cleaning body 171 and the rotation center of the second cleaning body 181 coincide with each other in a plan view, the second cleaning body 181 is horizontally moved in synchronization with the first cleaning body 171. Thereby, in comparison with the case where the first cleaning body 171 and the second cleaning body 181 are horizontally moved in the state where the rotation center of the first cleaning body 171 and the rotation center of the second cleaning body 181 are deviated from each other, it is possible to suppress more reliably the wafer W from being deflected.

The force received by the first cleaning body 171 when the first cleaning body 171 is deviated to the center side of the wafer W is lower than the force received when the position of the first cleaning body 171 is not deviated, and the force received when the first cleaning body 171 is deviated to the outer periphery side is higher than the force received when the position of the first cleaning body 171 is not deviated. Therefore, the controller 200 may detect the positional deviation of the first cleaning body 171 based on the detection result of the load detection unit 75 (see, e.g., FIG. 2). The same applies to the second cleaning body 181, and the controller 200 is capable of detecting the positional deviation of the second cleaning body 181 based on the detection result of the load detecting section 85.

The size of the contact surface of the first cleaning body 171 with the wafer W and the size of the contact surface of the second cleaning body 181 with the wafer W may be the same or different. For example, it is sometimes desirable that the circuit-formed surface of the wafer W be softly cleaned compared to the surface on which no circuit is formed. In such a case, the size of the contact surface of the first cleaning body 171 for cleaning the upper surface of the wafer W, which is the circuit forming surface, may be set to be larger than the size of the contact surface of the second cleaning body 181. By increasing the size of the contact surface, even when the first cleaning body 171 and the second cleaning body 181 are pressed against the wafer W with the same force, the force per unit area applied to the upper surface of the wafer W may be set to be smaller than the force per unit area applied to the lower surface. Therefore, it is possible to clean the upper surface of the wafer W more softly than the lower surface. In addition, the size of the contact surface of the second cleaning body 181 for cleaning the lower surface of the wafer W may be set to be larger than the size of the contact surface of the first cleaning body 171. By increasing the size of the contact surface, it is possible to clean the target surface in a shorter time. Further, by increasing the size of the contact surface, since it is possible to clean the cleaning target portion of the wafer W with a smaller moving amount, it is possible to downsize drive units (e.g., the rails 72, 82). Therefore, it is possible to downsize the substrate processing apparatus 1.

When it is desired to softly clean the circuit formation surface of the wafer W, the first cleaning body 171 for cleaning the upper surface, which is the circuit formation surface of the wafer W, may be formed of a material softer than that of the second cleaning body 181. By forming the first cleaning body 171 with a soft material, it is possible to make it difficult to scratch the circuit forming face, so that the upper surface of the wafer W can be cleaned more softly than the lower surface.

Figure 16:
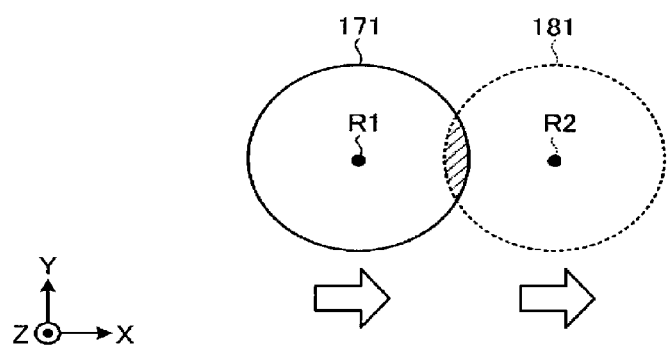
FIG. 16 is a view illustrating another example of a timing at which synchronization of a first cleaning body and a second cleaning body is started.
Figure 17:
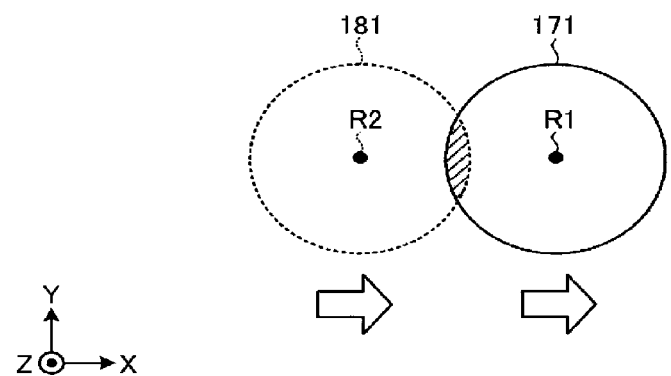
FIG. 17 is a view illustrating another example of a timing at which synchronization of a first cleaning body and a second cleaning body is started.

Here, when the first cleaning body 171 and the second cleaning body 181 completely overlap each other in a plan view, in other words, when the rotation center of the first cleaning body 171 and the rotation center of the second cleaning body 181 coincide with each other in a plan view, the second cleaning body 181 is moved in synchronization with the first cleaning body 171. However, the timing of starting synchronization between the first cleaning body 171 and the second cleaning body 181 is not limited to the example described above. This point will be described with reference to FIGS. 16 and 17. FIGS. 16 and 17 are views illustrating another example of the timing at which the synchronization of the first cleaning body 171 and the second cleaning body 181 is started.

In the example described above, when the timing at which the rotation center R1 of the first cleaning body 171 coincides with the rotation center R2 of the second cleaning body 181 in a plan view as the first cleaning body 171 moves in the X axis positive direction, the second cleaning body 181 is moved in synchronization with the first cleaning body 171. However, the synchronization between the first cleaning body 171 and the second cleaning body 181 may be started within a period where the contact surface of the first cleaning body 171 with the wafer W and the contact face of the second cleaning body 181 with the wafer W overlap in a plan view.

Accordingly, for example, as illustrated in FIG. 16, the second cleaning body 181 may be moved in synchronization with the first cleaning body 171 after a portion of the contact surface of the first cleaning body 171 and a portion of the contact surface of the second cleaning body 181 overlap due to the movement of the first cleaning body 171 in the X-axis direction and before the rotation center R1 of the first cleaning body 171 and the rotation center R2 of the second cleaning body 181 coincide with each other in a plan view. In addition, as illustrated in FIG. 17, as long as the contact surface of the first cleaning body 171 and the contact surface of the second cleaning body 181 are overlapping each other, the second cleaning body 181 may be moved in synchronization with the first cleaning body 171 after the rotation center R1 of the first cleaning body 171 and the rotation center R2 of the second cleaning body 181 are coincide with each other in a plan view.

Figure 18:
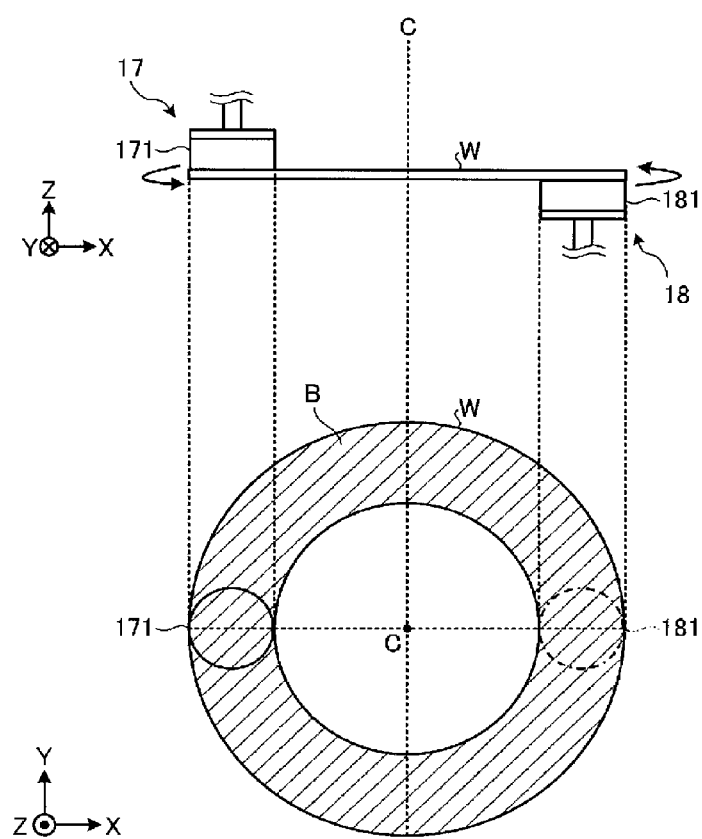
FIG. 18 is a view illustrating another example of a position where the second cleaning body overlaps the first cleaning body.

In addition, the contact surface of the second cleaning body 181 does not necessarily overlap the contact surface of the first cleaning body 171 in a plan view. This point will be described with reference to FIG. 18. FIG. 18 is a view illustrating another example of the position where the second cleaning body 181 overlaps the first cleaning body 171.

As illustrated in FIG. 18, the second cleaning body 181 may be horizontally moved in synchronization with the first cleaning body 171 such that the state where an area where the first cleaning body 171 is in contact with the upper surface of the wafer W (hereinafter referred to as a "contact area B") while the wafer W makes one revolution about the central axis C and the contact surface of the second cleaning body 181 with the wafer W overlap each other in a plan view is maintained. Even in this case, the force with which the second cleaning unit 18 pushes up the wafer W may be weakened by the force with which the first cleaning unit 17 pushes the wafer W down. Therefore, it is possible to set the pressing force of the second cleaning unit 18 high without deflecting the wafer W and without being restricted by the suction force of the spin chuck 11.

Figure 19:
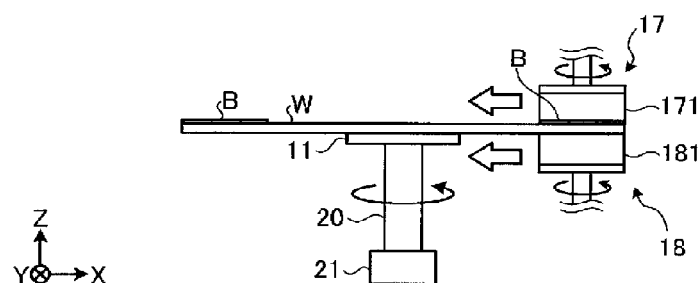
FIG. 19 is a diagram illustrating another operation example of a both-surface cleaning processing.
Figure 20:
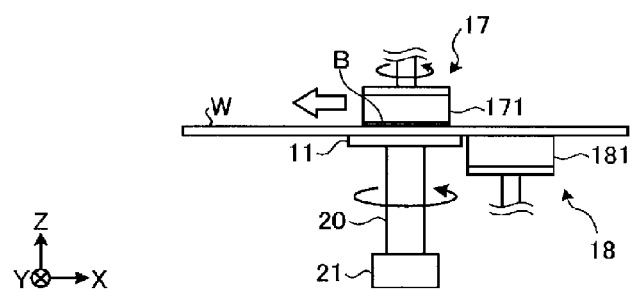
FIG. 20 is a view illustrating another operation example of a both-surface cleaning processing.
Figure 21:
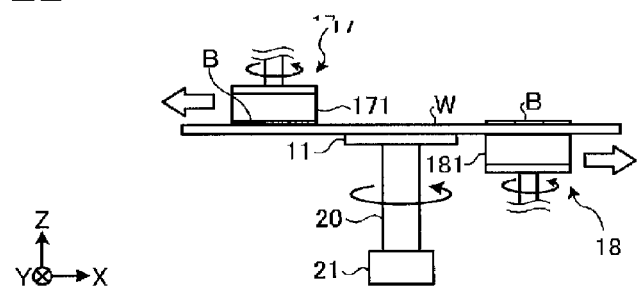
FIG. 21 is a view illustrating another operation example of a both-surface cleaning processing.

An example of a both-surface cleaning processing in this case will be described with reference to FIGS. 19 to 21. FIGS. 19 to 21 are views illustrating another operation example of a both-surface cleaning processing.

For example, as illustrated in FIG. 19, the first cleaning body 171 is brought into contact with the upper surface of the end portion, on the X axis positive direction side, of the wafer W, and the second cleaning body 181 is brought into contact with the lower surface of the end, on the positive X-axis direction side, of the wafer W. Subsequently, the first cleaning body 171 and the second cleaning body 181 are rotated to move the first cleaning body 171 and the second cleaning body 181 toward the end portion, on the negative X-axis direction side, of the wafer W in the negative X-axis direction at the same speed. As a result, the second cleaning body 181 moves while maintaining the state of overlapping the contact area B in a plan view.

Subsequently, as illustrated in FIG. 20, the movement and rotation of the second cleaning body 181 is stopped at a position just before the second cleaning body 181 interferes with the spin chuck 11. On the other hand, the movement of the first cleaning body 171 continues. As a result, the synchronization between the first cleaning body 171 and the second cleaning body 181 is released.

Subsequently, as illustrated in FIG. 21, when the first cleaning body 171 further moves in the negative X-axis direction and the second cleaning body 181 and the contact area B overlap again in a plan view, the second cleaning body 181, the second cleaning body 181 is rotated so as to move the second cleaning body 181 at the same speed as the first cleaning body 171 and in a direction opposite to that of the first cleaning body 171. As a result, the second cleaning body 181 moves again while maintaining a state of overlapping with the contact area B in a plan view. Thereafter, when the first cleaning body 171 reaches the end portion, on the negative X-axis side, of the wafer W and the second cleaning body 181 reaches the end portion, on the positive X-axis side, of the wafer W, rotation of the first cleaning body 171 and the second cleaning body 181 is stopped, and the both-surface cleaning processing is completed.

As described above, the substrate processing apparatus 1 according to the first embodiment includes a spin chuck 11 (an example of the holding unit), a first cleaning body 171, an arm 70, a moving unit 71, a rail 72 (an example of the first moving mechanism), a second cleaning body 181, an arm 80, a moving unit 81, and a rail 82 (an example of the second moving mechanism), and a controller 200. The spin chuck 11 holds a wafer W (an example of the substrate). The first cleaning body 171 is in contact the upper surface of the wafer W held by the spin chuck 11 and cleans the upper surface of the wafer W. The arm 70, the moving unit 71, and the rail 72 horizontally move the first cleaning body 171. The second cleaning body 181 is in contact with the lower surface of the wafer W held by the spin chuck 11 and cleans the lower surface of the wafer W. The arm 80, the moving unit 81, and the rail 82 horizontally move the second cleaning body 181. The controller 200 controls the moving unit 71 and the arm 80 so as to execute a both-surface cleaning processing in which the first cleaning body 171 which is in contact with the upper surface of the wafer W and the second cleaning body 181 which is in contact with the lower surface of the wafer W are horizontally moved in synchronization.

For example, the controller 200 executes the processing of horizontally moving the first cleaning body 171 and the second cleaning body 181 while maintaining the state where the contact surface of the first cleaning body 171 with the upper surface of the wafer W and the contact surface of the second cleaning body 181 with the lower surface of the wafer W when the wafer W held on the spin chuck 11 is viewed in a plan view in the thickness direction overlap each other, as a both-surface cleaning processing.

As a result, for example, since the force with which the first cleaning unit 17 pushes down the wafer W and the force with which the second cleaning unit 18 pushes up the wafer W can cancel each other, it is possible to set the pressing forces of the first cleaning body 171 and the second cleaning section 18 to a high level without deflecting the wafer W and without being restricted by the suction force of the spin chuck 11. Therefore, with the substrate processing apparatus 1 of the first embodiment, it is possible to strongly clean the wafer W using the first cleaning body 171 and the second cleaning body 181.

In addition, the substrate processing apparatus 1 further includes a first drive unit 173 configured to rotate the first cleaning body 171 around a vertical axis and a second drive unit 183 configured to rotate the second cleaning body 181 around a vertical axis, in the state where the center of rotation of the first cleaning body 171 by the first drive unit 173 and the center of rotation of the second cleaning body 181 by the second drive unit 183 coincide with each other, the controller 200 executes a processing of horizontally moving the first cleaning body 171 and the second cleaning body 171 as a both side cleaning processing. This makes it possible to more reliably suppress the deflection of the wafer W in comparison with the case where the rotation center of the first cleaning body 171 and the rotation center of the second cleaning body 181 are deviated.

Further, in the both-surface cleaning processing, the controller adjusts the height position of at least one of the first cleaning body 171 and the second cleaning body 181 by controlling at least one of the moving unit 71 and the moving unit 81 such that the pressing force of the first cleaning body 171 against the upper surface of the wafer W and the pressing force of the second cleaning body 181 against the lower surface of the wafer W have the same magnitude. In this way, by making the pressing force of the first cleaning body 171 against the upper surface of the wafer W and the pressing force of the second cleaning body 181 against the lower surface of the wafer W have the same magnitude, it is possible to suppress the wafer W from being deflected downward, for example, when the pressing force of the body 171 exceeds the pressing force of the second cleaning body 181, or to suppress the wafer W from being deflected downward, for example, when the pressing power of the second cleaning body 181 exceeds the pressing force of the first cleaning body 171.

The substrate processing apparatus 1 further includes a load detection unit 75, 85 configured to detect the pressing force of the first cleaning body 171 against the upper surface of the wafer W or the pressing force of the second cleaning body 181 against the lower surface of the wafer W. The controller 200 arranges one of the first cleaning body 171 and the second cleaning body 181 at a predetermined height position, and adjusts the height of the other of the first cleaning body 171 and the second cleaning body 181 based on the detection result of the load detection unit 75, 85. This is capable of facilitating adjustment of the pressing forces.

Second Embodiment

Figure 22:
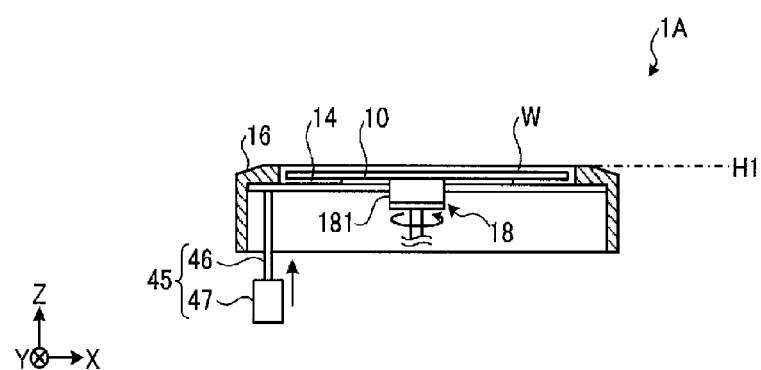
FIG. 22 is a view illustrating the height position of an upper cup in a lower surface cleaning processing.
Figure 23:
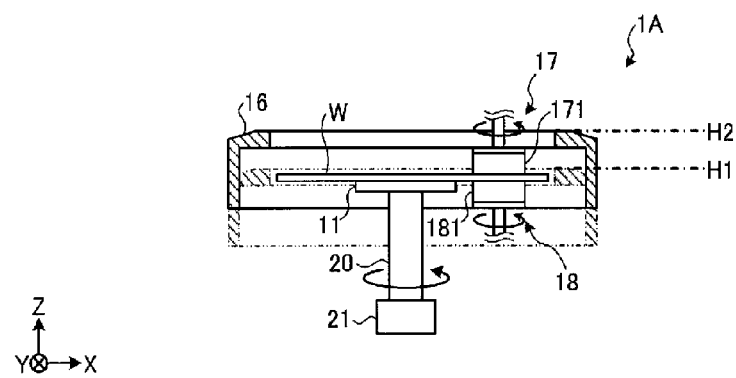
FIG. 23 is a view illustrating the height position of the upper cup in a both-surface cleaning processing.

In the first embodiment described above, the lower surface cleaning processing (step S102) and the both-surface cleaning processing (step S103) are performed in the state where the height of the upper cup 16 is maintained constant. However, in the lower surface cleaning processing and the both-surface cleaning processing, the height of the upper cup 16 may be changed. Such a case will be described with reference to FIGS. 22 and 23. FIG. 22 is a view illustrating the height position of the upper cup 16 in the lower surface cleaning processing, and FIG. 23 is a view illustrating the height position of the upper cup 16 in the both-surface cleaning processing.

For example, as illustrated in FIG. 22, the substrate processing apparatus 1 according to the second embodiment includes a lift mechanism 45 configured to raise and lower the support plate 14 independently of the upper cup 16. The lift mechanism 45 includes, for example, a support post member 46 configured to support the support plate 14 and a drive unit 47 configured to moves up and down the support post member 46.

In the substrate processing apparatus 1, in the lower surface cleaning processing, the height position of the upper cup 16 is set to H1 by raising the support plate 14 using the lift mechanism 45. The height position of the upper cup 16 refers to the height position of the upper cup 16 when the upper surface of the wafer W sucked and held by the suction pads 10 or the spin chuck 11 is used as a reference. The height position H1 is a position at which, for example, pure water can be suppressed from turning around from the lower surface to the upper surface of the wafer W.

Subsequently, in the substrate processing apparatus 1A, a both-surface cleaning processing is performed after setting the height position of the upper cup 16 to H2 higher than H1. That is, after the height position of the upper cup 16 is changed to H2, the supply of pure water from the cleaning nozzle 70a to the upper surface of the wafer W is started. The height position H2 is a height position at which it is possible to suppress scattering of, for example, pure water which scatters from the rotating first cleaning body 171 to the outside of the upper cup 16. The height position of the upper cup 16 may be changed, for example, by adjusting the height position of the spin chuck 11.

In this way, the substrate processing apparatus 1A may change the height position of the upper cup 16 with respect to the wafer W in the lower surface cleaning processing and the both-surface cleaning processing. As a result, it is possible to suppress, for example, pure water from turning around to the upper surface of the wafer W during the lower surface cleaning processing and to suppress, for example, pure water from scattering to the outside of the upper cup 16 in the both-surface cleaning processing.

Third Embodiment

Figure 24:
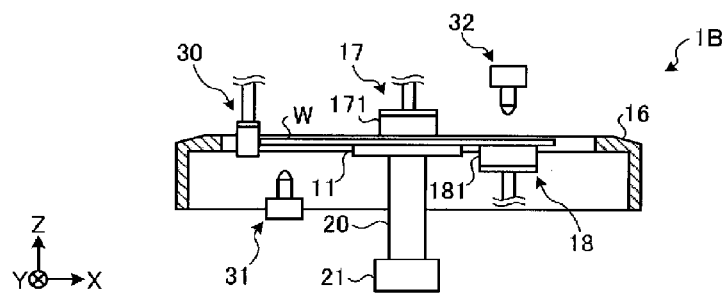
FIG. 24 is a view illustrating an operation example of other cleaning tools.

In each of the embodiments described above, the example in which the substrate processing apparatus 1, 1A includes the first cleaning unit 17 and the second cleaning unit 18 as cleaning tools has been described, but other cleaning tools may be provided. This point will be described with reference to FIG. 24. FIG. 24 is a view illustrating an operation example of other cleaning tools.

As illustrated in FIG. 24, in addition to the first cleaning unit 17 and the second cleaning unit 18, the substrate processing apparatus 1B according to the third embodiment may include, for example, a third cleaning unit 30 configured to clean an end of a wafer W using a cleaning body such as a brush or sponge, a fourth cleaning unit 31 configured to supply a cleaning fluid toward the lower surface of the wafer W, and a fifth cleaning unit 32 configured to supply a cleaning fluid toward the upper surface of the wafer W. In the substrate processing apparatus 1B, among the plurality of cleaning tools, an optimal tool may be selected and used depending on the type of a target wafer W.

For example, in the lower surface cleaning processing, in addition to the second cleaning unit 18, the lower surface of the wafer W may be cleaned using the fourth cleaning unit 31. Further, in the both-surface cleaning processing, in addition to the first cleaning unit 17, the upper surface of the wafer W may be cleaned using the fifth cleaning unit 32. In this way, by simultaneously performing cleaning with a plurality of kinds of cleaning tools, it is possible to shorten the cleaning time. Further, for example, dust floating by the first cleaning body 171 or the second cleaning body 181 can be efficiently removed using the fourth cleaning section 31 or the fifth cleaning section 32. After the both-surface cleaning processing is completed, a rinsing processing may be performed using the fourth cleaning unit 31 and the fifth cleaning unit 32, and then a drying processing may be performed.

The fourth cleaning unit 31 and the fifth cleaning unit 32 are, for example, two-fluid nozzles. The fourth cleaning unit 31 and the fifth cleaning unit 32 as two-fluid nozzles atomizes cleaning liquid and spray the atomized cleaning liquid onto the wafer W. The fourth cleaning unit 31 and the fifth cleaning unit 32 are not limited to the two-fluid nozzles, and may be normal nozzles that eject the cleaning liquid.

Further, the substrate processing apparatus 1B may include a plurality of first cleaning units 17 having different removal performances. For example, when a high removal performance is required, a first cleaning unit 17 having a first cleaning body 171 with a high removal performance may be used, or in the case where it is desired to perform cleaning the upper surface as much as possible without damaging the upper surface, the soft first cleaning unit 17 having a soft first cleaning section 17 may be used. Similarly, the substrate processing apparatus 1B may include a plurality of second cleaning units 18 having different removal performances.

In this manner, the substrate processing apparatus 1B may be provided with cleaning tools other than the first cleaning unit 17 and the second cleaning unit 18.

Fourth Embodiment

Figure 25:
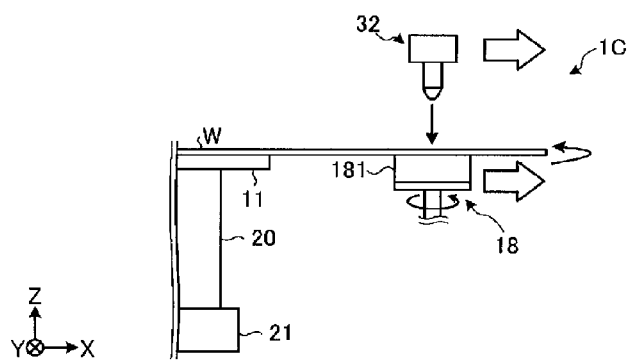
FIG. 25 is a view illustrating an operation example of a both-surface cleaning processing according to a fourth embodiment.

In the embodiments described above, both sides of a wafer W are simultaneously cleaned by synchronizing the first cleaning body 171 and the second cleaning body 181 in a both-surface cleaning processing, but the cleaning tool synchronized with the second cleaning body 181 is not limited to the first cleaning body 171. This point will be described with reference to FIG. 25. FIG. 25 is a view illustrating an operation example of a both-surface cleaning processing according to a fourth embodiment.

As illustrated in FIG. 25, the substrate processing apparatus 1C according to the fourth embodiment includes, for example, a second cleaning unit 18 and a fifth cleaning unit 32 as cleaning tools. The fifth cleaning unit 32 is a two-fluid nozzle.

The substrate processing apparatus 1C according to the fourth embodiment performs the both-surface cleaning processing by synchronizing the second cleaning unit 18 and the fifth cleaning unit 32. Specifically, as is the case when the first cleaning body 171 and the second cleaning body 181 are synchronized, as illustrated in FIG. 25, when the fifth cleaning unit 32 reaches a position where the ejection position of the fifth cleaning unit 32 and the contact surface of the second cleaning body 181 overlap in a plan view, the second cleaning section 181 is rotated and is horizontally moved at the same speed and in the same direction (positive X-axis direction) as the fifth cleaning section 181.

With the substrate processing apparatus 1C according to the fourth embodiment, the force with which the second cleaning unit 18 pushes up the wafer W is weakened by the force with which the mist-type cleaning liquid supplied from the fifth cleaning unit 32 pushes down the wafer W. Therefore, it is possible to set the pressing force of the second cleaning unit 18 high without deflecting the wafer W and without being restricted by the suction force of the spin chuck 11. In the both-surface cleaning processing using the second cleaning unit 18 and the fifth cleaning unit 32 as well, the height position of the upper cup 16 may be set to a position higher than the height position H1 during the lower surface cleaning processing. This makes it possible to suppress the atomized cleaning liquid supplied from the fifth cleaning unit 32 from scattering to the outside of the upper cup 16.

Fifth Embodiment

Figure 26:
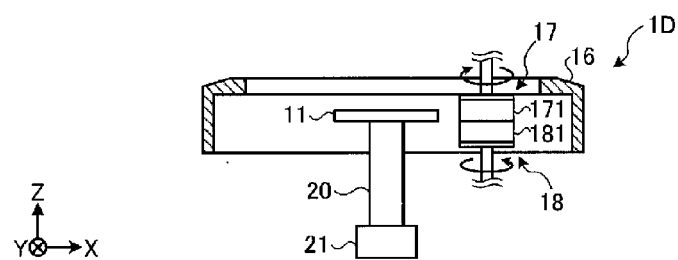
FIG. 26 is a view illustrating an operation example of a tool cleaning processing.

In the fifth embodiment, a cleaning processing performed using both a cleaning tool that cleans the upper surface of a wafer W and a cleaning tool for cleaning the lower surface of the wafer W will be described with reference to FIG. 26. FIG. 26 is a view illustrating an operation example of a tool cleaning processing.

As illustrated in FIG. 26, a substrate processing apparatus 1D according to the fifth embodiment includes, for example, a second cleaning unit 17 and a fifth cleaning unit 18. When a wafer W is not sucked and held by the suction pads 10 and the spin chuck 11, the substrate processing apparatus 1D performs a tool cleaning processing, for example, after the carry-out processing (step S105) and before the carry-in processing of the next wafer W (step S101).

Specifically, in a state where the contact surface of the first cleaning body 171 with the wafer W and the contact surface of the second cleaning body 181 with the wafer W are brought into contact with each other, the substrate processing apparatus 1D rotates the first cleaning body 171 and the second cleaning body 181. In addition, the substrate processing apparatus 1D supplies pure water from the cleaning nozzle 70a to the second cleaning body 181. As a result, it is possible to clean the contact surface of the first cleaning body 171 and the contact surface of the second cleaning body 181 at the same time. At this time, by rotating the first cleaning body 171 in a direction opposite to the rotating direction of the second cleaning body 181, it is possible to clean the contact face of the first cleaning body 171 and the contact face of the second cleaning body 181 more strongly.

The tool cleaning processing is not limited to the example described above. For example, the substrate processing apparatus 1B according to the third embodiment may perform a tool cleaning processing of cleaning the contact surface of the second cleaning body 181 by supplying a cleaning fluid from the fifth cleaning unit 32 toward the contact surface of the second cleaning body 181. In addition, the substrate processing apparatus 1B may perform a tool cleaning processing of cleaning the contact surface of the first cleaning body 171 by supplying a cleaning fluid from the fourth cleaning unit 31 toward the contact surface of the first cleaning body 171.

Sixth Embodiment

Figure 27:
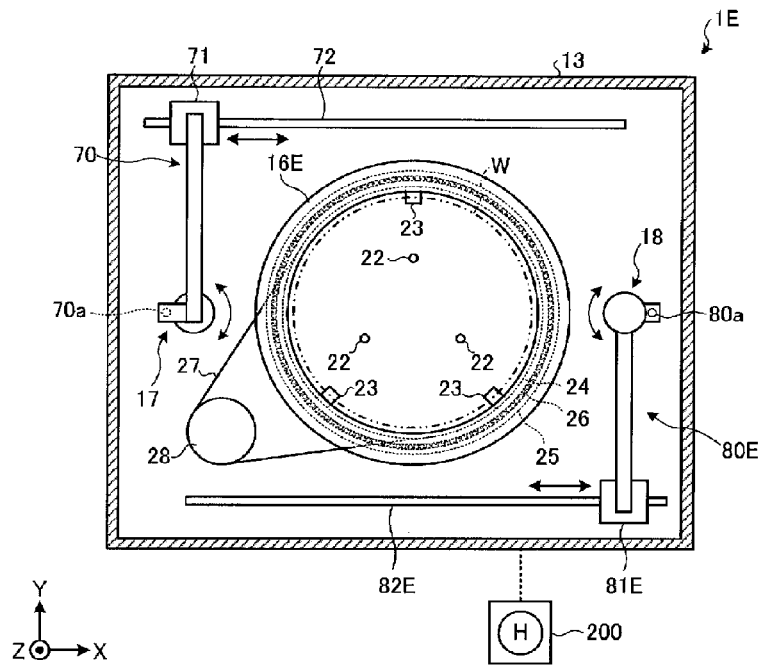
FIG. 27 is a plan view illustrating a configuration of a substrate processing apparatus according to a sixth embodiment.
Figure 28:
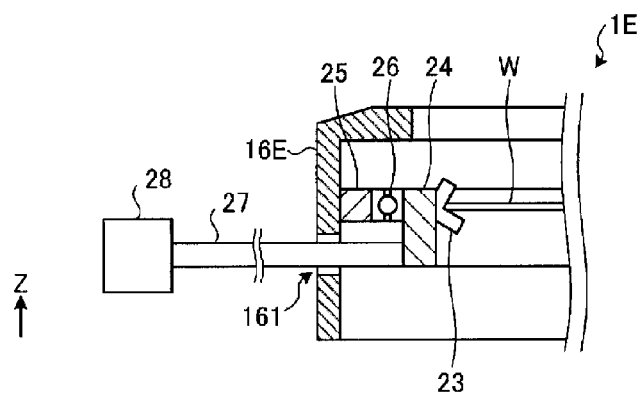
FIG. 28 is a vertical sectional view illustrating the configuration of the substrate processing apparatus according to the sixth embodiment.
Figure 29:
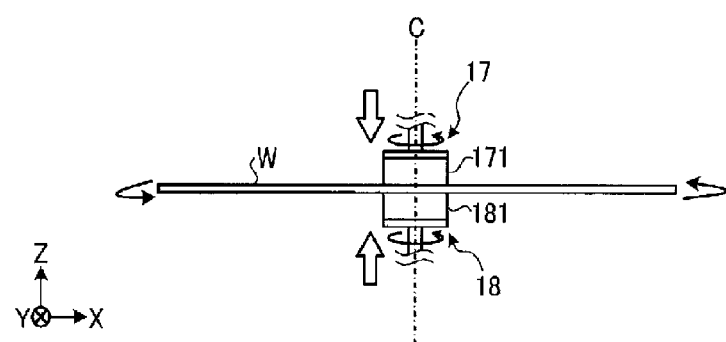
FIG. 29 is a view illustrating an operation example of the both-surface cleaning processing according to the sixth embodiment.
Figure 30:
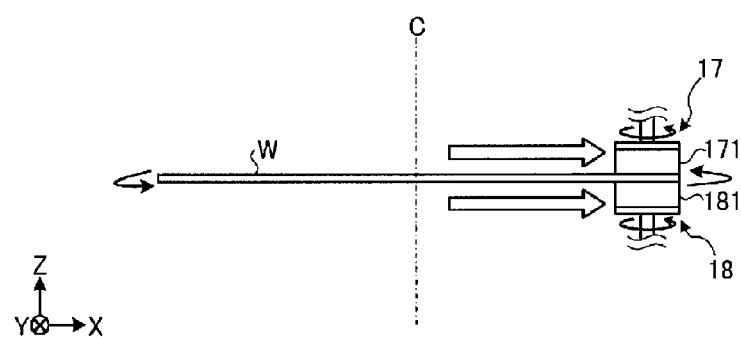
FIG. 30 is a view illustrating an operation example of the both-surface cleaning processing according to the sixth embodiment.

In each of the above-described embodiments, an example in which the first cleaning unit 17 and the second cleaning unit 18 are partially synchronized in the both-surface cleaning processing has been described, but it is possible to fully synchronize the first cleaning unit 17 and the second cleaning unit 18. This point will be described with reference to FIGS. 27 to 30. FIG. 27 is a plan view illustrating a configuration of a substrate processing apparatus according to a sixth embodiment. FIG. 28 is a vertical sectional view illustrating the configuration of the substrate processing apparatus according to the sixth embodiment. FIGS. 29 and 30 are views illustrating an operation example of the both-surface cleaning processing according to the sixth embodiment.

As illustrated in FIGS. 27 and 28, the substrate processing apparatus 1E according to the sixth embodiment includes an annular holding unit 24 having a plurality of gripping portions 23 that grip the peripheral portion of a wafer W, an annular fixing unit 25 concentrically arranged with the holding unit 24 on the outer peripheral side of the holding unit 24, and an annular bearing 26 arranged between the holding unit 24 and the fixing unit 25.

The fixing unit 25 is fixed to, for example, the inner wall of the upper cup 16E. The holding unit 24 is rotatably supported by the fixing unit 25 via the bearing 26. The bearing 26 is, for example, a ball bearing.

In addition, the substrate processing apparatus 1E includes a belt 27 bridged around the peripheral surface of the holding unit 24 and a drive unit 28 that rotates the holding unit 24 via the belt 27. The belt 27 is drawn to the outside of the upper cup 16E through an opening 161 formed in the side surface of the upper cup 16E, for example, and connected to the drive unit 28.

In addition, as illustrated in FIG. 27, the second cleaning unit 18 according to the sixth embodiment is horizontally supported by an arm 80E. The arm 80E is connected to the moving unit 81E. The moving unit 81E horizontally moves the arm 80E along a rail 82E extending in a horizontal direction (here, the X-axis direction). Further, the moving unit 81E moves up and down the arm 80E in the vertical direction (Z-axis direction).

The substrate processing apparatus 1E according to the sixth embodiment starts a both-surface cleaning processing (step S103) without carrying out the lower surface cleaning processing (step S102) after the carry-in processing (step S101). As illustrated in FIG. 29, in the both-surface cleaning process according to the sixth embodiment, the first cleaning body 171 is pressed against the central portion of the upper surface of the wafer W, and the second cleaning body 181 is pressed against the central portion of the lower surface of the wafer W. Thereafter, the wafer W is rotated by rotating the holding unit 24 using the drive unit 28. In addition, the first cleaning body 171 and the second cleaning body 181 are rotated. In addition, after rotating the wafer W, the first cleaning body 171, and the second cleaning body 181, the first cleaning body 171 and the second cleaning body 181 may be pressed against the wafer W.

Subsequently, as illustrated in FIG. 30, the first cleaning body 171 and the second cleaning body 181 are horizontally moved in the same direction (positive X-axis direction) at the same speed toward the outer peripheral portion of the wafer W. As a result, the entire upper surface of the wafer W is cleaned by the first cleaning body 171, and the entire lower surface of the wafer W is cleaned by the second cleaning body 181.

As described above, in the substrate processing apparatus 1E according to the sixth embodiment, since the spin chuck 11 does not exist in the central portion of the lower surface of the wafer W, the movement of the second cleaning body 181 starts from the central portion of the lower surface of the wafer W. Therefore, with the substrate processing apparatus 1E according to the sixth embodiment, it is possible to fully synchronize the first cleaning body 171 and the second cleaning body 181 in the both-surface cleaning processing.

In this case, the both-surface cleaning processing is started from the central portion of the wafer W. However, the both-surface cleaning processing may be started from one side end (e.g., the negative X-axis direction side) of the wafer W. That is, the first cleaning body 171 and the second cleaning body 181 may be moved from one end portion of the wafer W to the other end portion at the same speed.

Here, an example when the holding unit 24 is rotated by using the belt 27 is illustrated, but the method of rotating the holding unit 24 is not limited to this example. For example, the holding unit 24 may be rotated using a gear box. In addition, a configuration may be adopted which includes a holding plate configured to hold the outer periphery of a wafer W, a shaft connected to a lower portion of the holding plate, and a drive unit configured to rotate the shaft, in which a through hole may be formed to vertically penetrate the holding plate and the shaft and an arm supporting the second cleaning body 181 may be inserted into the hole such that the second cleaning body 181 is disposed between the wafer W and the holding plate. According to this configuration, the second cleaning body 181 can be moved from the central portion to the outer peripheral portion of the wafer W without interfering with the shaft.

Seventh Embodiment

Figure 31:
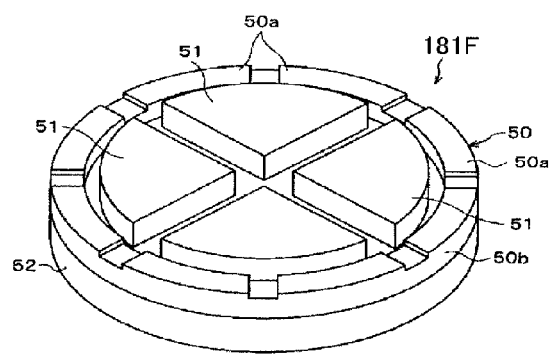
FIG. 31 is a perspective view illustrating a configuration of a second cleaning body according to a seventh embodiment.
Figure 32:
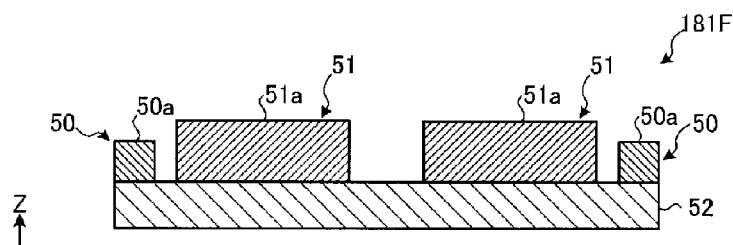
FIG. 32 is a vertical sectional view illustrating the configuration of the second cleaning body according to the seventh embodiment.
Figure 33:
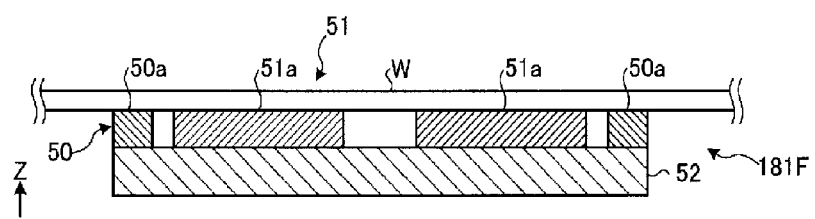
FIG. 33 is a view illustrating a state where the second cleaning body according to the seventh embodiment is pressed against a wafer.

In the seventh embodiment, another configuration example of the first cleaning body 171 and the second cleaning body 181 will be described. As another example, another configuration example of the second cleaning body 181 is illustrated in FIGS. 31 to 33. FIG. 31 is a perspective view illustrating a configuration of a second cleaning body according to the seventh embodiment. FIG. 32 is a vertical sectional view illustrating the configuration of the second cleaning body according to the seventh embodiment. FIG. 33 is a view illustrating a state where the second cleaning body according to the seventh embodiment is pressed against a wafer W.

The second cleaning body 181F according to the seventh embodiment illustrated in FIG. 31 also has a function as a polishing body that polishes the lower surface of the wafer W in addition to the function as a cleaning body.

Specifically, as illustrated in FIG. 31, the second cleaning body 181F includes, for example, a polishing member 50 having a polishing surface 50a made of, for example, foamed urethane or nonwoven fabric, a polishing member 50 made of a freely stretchable material such as, for example, polyvinyl alcohol, polypropylene, or nylon, and a support member 52 that supports the polishing member 50 and the cleaning member 51. The polishing surface 50a of the polishing member 50 is configured by attaching a sheet formed of foamed urethane or nonwoven fabric on the upper surface of a substantially ring-shaped annular member 50b formed to be smaller than the diameter of the wafer W, for example, having a diameter of about a quarter of the wafer W. As an example of the shape of the polishing member 50, FIG. 31 illustrates a state where eight polishing surfaces 50a, each having a circular arc shape having a predetermined width, are provided in a concentric form at a predetermined interval.

The cleaning member 51 is formed in, for example, a fan shape, and a plurality of cleaning members 51 are arranged inside the annular polishing members 50 so as to be concentric with the polishing members 50. FIG. 31 also illustrates an example in the case where four cleaning members 51 formed in a fan shape are arranged inside the polishing members 50.

The surfaces of the polishing members 50 and the cleaning members 51 on the opposite side to the support member 52 are the polishing surfaces 50a and the cleaning surfaces which are provided to face the wafer W respectively. For example, as illustrated in FIG. 32, the cleaning surfaces 51a of the cleaning members 51 are formed to protrude upward from the polishing surfaces 50a of the polishing members 50. Therefore, when the second cleaning body 181F is brought close to the lower surface of the wafer W, the cleaning members 51 first come into contact with the lower surface of the wafer W. Since the cleaning members 51 are made of a freely stretchable material, when the second cleaning body 181F is pressed toward the wafer W even after the cleaning members 51 come into contact with the wafer W, the cleaning members 51 are compressed and the polishing members 50 also come into contact with the lower surface of the wafer W, for example, as illustrated in FIG. 33, so that the polishing processing of the wafer W can be performed.

In this way, the second cleaning body 181F may have a function as a polishing body. In this case, for example, as illustrated in FIG. 33, the lower surface of the wafer W can be polished by rotating the second cleaning body 181F in the state where the polishing member 50 is in contact with the lower surface of the wafer W. Thereafter, it is possible to clean the lower surface of the wafer W by lowering the second cleaning body 18F such that only the cleaning member 51 is in contact with the lower surface of the wafer W and then rotating the second cleaning body 181F.

Eighth Embodiment

Figure 34:
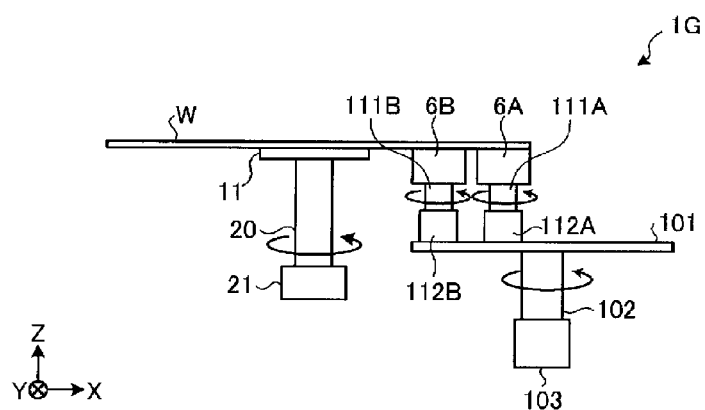
FIG. 34 is a side view illustrating a configuration of a substrate processing apparatus according to an eighth embodiment.

In the eighth embodiment, the configuration of a substrate processing apparatus having a cleaning body and a polishing unit separately will be described with reference to FIGS. 34 to 36. FIG. 34 is a side view illustrating the configuration of the substrate processing apparatus according to the eighth embodiment. In addition, FIGS. 35 and 36 are plan views illustrating a wafer, a cleaning body, a polishing body, and a rotating plate.

As illustrated in FIG. 34, the substrate processing apparatus 1G according to the eighth embodiment includes: a rotating plate 101 that is formed of, for example, a circular plate and forms a planar body provided to face a wafer W held by the suction pads 10 or the spine chuck; and a cleaning body 6A and a polishing body 6B which are provided on the rotating plate 101. The rotating plate 101 is configured to be rotatable around a vertical axis by a drive mechanism 103 via a pivot shaft 102 provided on the lower surface side thereof. The pivot shaft 102 is provided at the center of the rotating plate 101. Therefore, the center of the rotating plate 101 and the center of the pivot shaft 102 are aligned in a plan view, and these centers become the pivot center O1. In this example, a pivot mechanism is formed by the rotating plate 101, the pivot shaft 102, and the drive mechanism 103.

Figure 35:
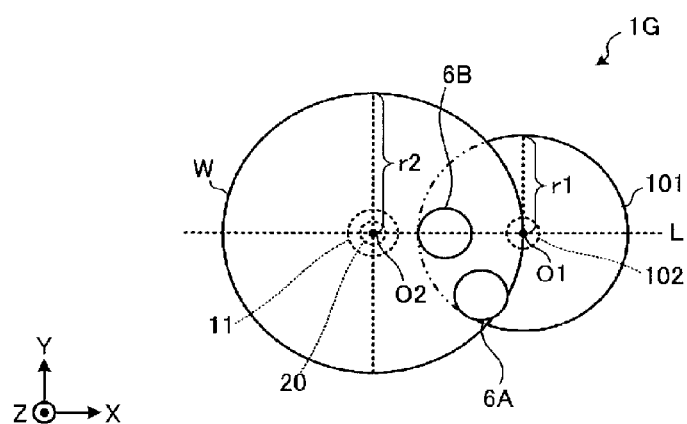
FIG. 35 is a plan view illustrating a wafer, a cleaning body, a polishing body, and a rotating plate.
Figure 36:
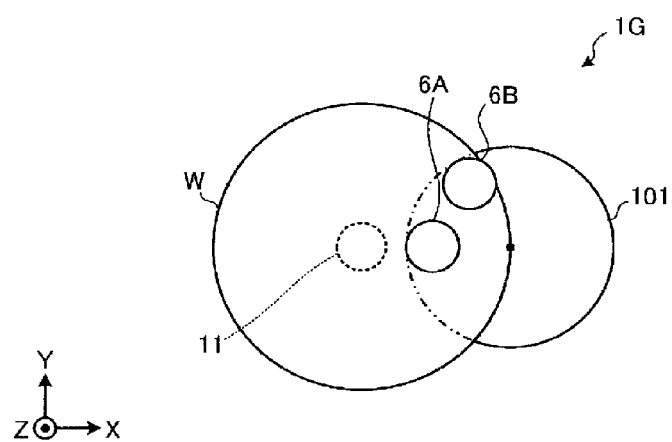
FIG. 36 is a plan view illustrating a wafer, a cleaning body, a polishing body, and a rotating plate.

As illustrated in FIG. 35, the rotating plate 101 is set such that the radius r1 of the rotating plate 101 is smaller than the radius r2 of the wafer W. When an area including the central portion of the lower surface of the wafer W is cleaned, the wafer W is held by the suction pads 10 and horizontally moved, but the pivot shaft 102 is provided within the moving area of the wafer W. That is, when cleaning the area including the central portion of the lower surface of the wafer W, the pivot shaft 102 is disposed to overlap the wafer W. Furthermore, in a plan view, the pivot shaft 102 of the rotating plate 101 and the shaft 20 of the spin chuck 11 are provided to be aligned in the horizontal direction (X-axis direction).

The cleaning body 6A and the polishing body 6B are made of, for example, cylindrical brushes and are connected to the drive mechanisms 112A and 112B via drive shafts 111A and 111B, respectively. The drive mechanisms 112A and 112B are provided on the rotating plate 101 and move up and down and rotate the cleaning body 6A and the polishing body 6B around the vertical axis.

The cleaning body 6A and the polishing body 6B are disposed on the rotating plate 101 so as to be laterally separated from each other. The cleaning body 6A and the polishing body 6B are disposed such that the cleaning body 6A and the polishing body 6B pivot in one direction while the wafer W is being held and rotated by the spin chuck 11, so that all the area of the lower surface of the wafer W, except for the central portion of the lower surface of the wafer W can be cleaned and polished by both the cleaning body 6A and the polishing body 6B. Description "pivots in one direction" means that when the shaft 20 of the spin chuck 11 is viewed from the pivot shaft 102 of the rotating plate 101, the cleaning body 6A positioned on one of the left side and the right side (in this example, the left side) pivots and moves toward the other side (in this example, the right side).

In this example, in a plan view, with respect to the wafer W held by the spin chuck 11, when the cleaning body 6A is positioned in the center, the polishing body 6B is positioned in the peripheral edge, and when the polishing body 6B is positioned in the center, the cleaning body 6A is positioned in the peripheral edge. The description "positioned in the peripheral edge" means that the cleaning body 6A and the polishing body 6B are positioned so as to be able to clean (polish) the outer edge of the wafer W held by the spin chuck 11, and the description "positioned in the center" means that the cleaning body 6A and the polishing body 6B are positioned so as to be able to perform cleaning (polishing) on a straight line L connecting the rotation center O2 of the spin chuck 11 and the pivot center O1. FIG. 35 illustrates a state where the cleaning body 6A is positioned on the periphery and the polishing body 6 B is positioned in the center, and FIG. 36 illustrates a state where the cleaning body 6A is positioned in the center and the polishing body 6 B is positioned in the periphery.

When the cleaning body 6A positioned on the left side starts to pivot toward the right side, the polishing body 6B is positioned on a straight line L connecting the pivot shaft 102 of the rotating plate 101 and the shaft 20 of the spin chuck 11, and when the pivot is ended, the cleaning body 6A is positioned on the straight line L. Further, since the radius r1 of the rotating plate 101 is shorter than the radius r2 of the wafer W, the pivot radius of the cleaning body 6A and the polishing body 6B is shorter than the radius r2 of the wafer W. The pivot radius means the length of the line connecting the centers of the cleaning body 6A and the polishing body 6B and the pivot center O1 of the rotating plate 101.

As described above, the cleaning body 6A and the polishing body 6B are not limited to the case of being integrally provided like the second cleaning body 181F according to the seventh embodiment, and may be provided separately.

Ninth Embodiment

Figure 37:
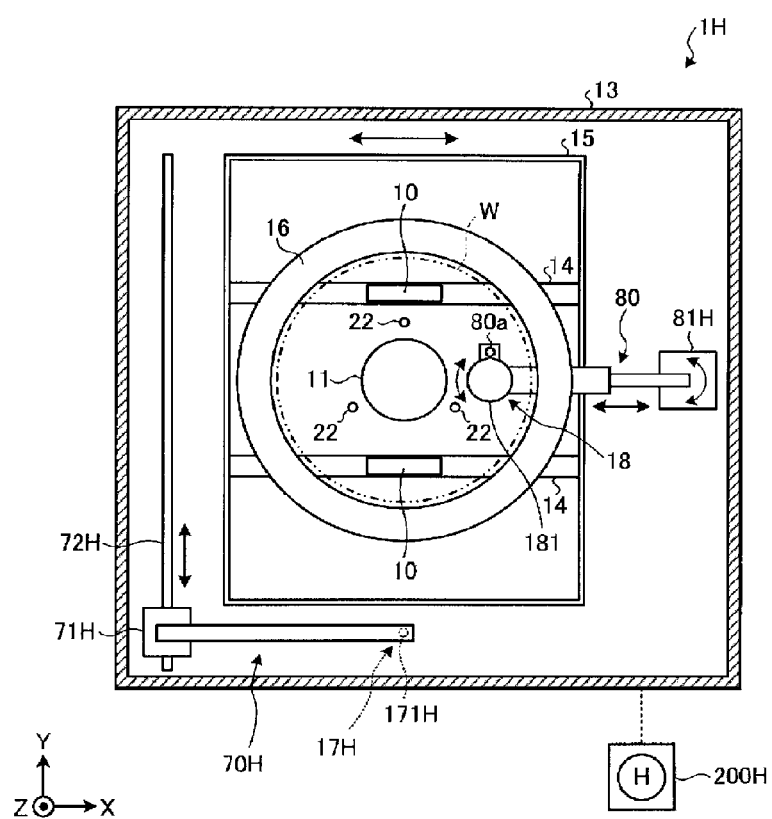
FIG. 37 is a plan view illustrating a configuration of a substrate processing apparatus according to a ninth embodiment.

Next, the ninth embodiment will be described with reference to FIGS. 37 to 39. First, a configuration example of the substrate processing apparatus 1 according to the ninth embodiment will be described with reference to FIG. 37. FIG. 37 is a plan view illustrating the configuration of the substrate processing apparatus according to the ninth embodiment.

As illustrated in FIG. 37, the substrate processing apparatus 1H according to the ninth embodiment includes a first cleaning unit 17H.

The first cleaning unit 17H includes a first cleaning body 171H. The first cleaning body 171H is, for example, a two-fluid nozzle. The first cleaning body 171H mixes a gas supplied from a gas supply source (not illustrated) and a liquid supplied from a liquid supply source (not illustrated), and ejects the mixed fluid in which the gas and the liquid are mixed with each other onto the upper surface of a wafer W. The gas supplied from the gas supply source is, for example, an inert gas such as nitrogen. The liquid supplied from the liquid supply source is, for example, pure water.

The first cleaning unit 17H is horizontally supported by an arm 70H, and the arm 70H is connected to a moving unit 71H. The moving unit 71H horizontally moves the arm 70H along a rail 72H extending in a horizontal direction (here, a Y-axis direction).

In the substrate processing apparatus 1H according to the ninth embodiment, an arm 80 that supports the second cleaning unit 18 is connected to a swivel unit 81H, and the swivel unit 81H swivels the arm 80 around a vertical axis. Similar to the substrate processing apparatus 1 according to the first embodiment, the substrate processing apparatus 1H may include a moving unit 81 that horizontally moves the arm 80.

Next, a low surface cleaning processing in the ninth embodiment will be described with reference to FIG. 38. FIG. 38 is a view illustrating an operation example of the lower surface cleaning processing in the ninth embodiment.

Figure 38:
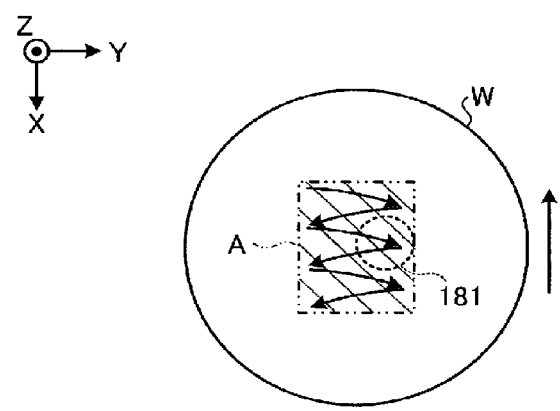
FIG. 38 is a view illustrating an operation example of the lower surface cleaning processing in the ninth embodiment.

As illustrated in FIG. 38, in the ninth embodiment, the cleaning of the lower surface of the wafer W by the second cleaning unit 18 proceeds by a combination of a movement of the wafer W by the suction pads 10 and a swivel movement of the second cleaning unit 18 by the swivel unit 81H. Specifically, a controller 200H rotates the second cleaning body 181 and repeats a swivel movement in one direction (e.g., the positive Y-axis direction) and a swivel movement in the other direction (e.g., the negative Y-axis direction) a predetermined number of times. Further, the controller 200H moves the wafer W in the negative X-axis direction by the suction pads 10. As a result, the central area A is cleaned by the second cleaning body 181.

Next, a both-surface cleaning processing according to the ninth embodiment will be described with reference to FIG. 39. FIG. 39 is a view illustrating an operation example of the both-surface cleaning processing in the ninth embodiment.

Figure 39:
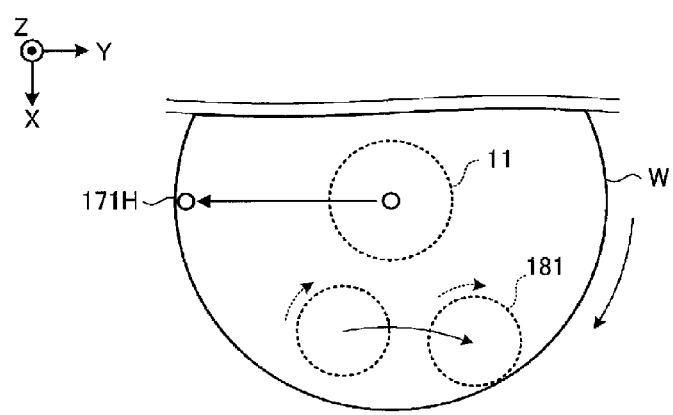
FIG. 39 is a view illustrating an operation example of the both-surface cleaning processing in the ninth embodiment.

As illustrated in FIG. 39, in the both-surface cleaning processing, the controller 200H horizontally moves the first cleaning body 171H and the second cleaning body 181 in a direction in which the first cleaning body 171H and the second cleaning body 181 are separated away from each other.

In a case where the ejection position of the first cleaning body 171H and the rotation center of the second cleaning body 181 do not overlap each other in a plan view, when the distance between the first cleaning body 171H and the second cleaning body 181 is short, the lower surface of the wafer W may not be properly cleaned by the second cleaning body 181. This is because the wafer W is deflected due to the pressure of the mixed fluid ejected from the first cleaning body 171H, whereby the wafer W partially floats from the second cleaning body 181. Therefore, in the case the ejection position of the first cleaning body 171H and the rotation center of the second cleaning body 181 do not overlap each other in plan view, it is better to separate the first cleaning body 171H and the second cleaning body 181 from each other as much as possible.

Thus, in the ninth embodiment, in the both-surface cleaning processing, the controller 200H horizontally moves the first cleaning body 171H and the second cleaning body 181 in the direction in which the first cleaning body 171H and the second cleaning body 181 are separated away from each other. Thus, since the first cleaning body 171H and the second cleaning body 181 do not come closer to each other, the wafer W is suppressed from partially floating from the second cleaning body 181 due to deflection of the wafer W due to the pressure of the mixed fluid. Therefore, since it is possible to properly perform the cleaning of the lower surface of the wafer W by the second cleaning body 181, it is possible to strongly clean the wafer W using the second cleaning body 181.

Specifically, first, the controller 200H rotates the wafer W by rotating the spin chuck 11. In addition, the controller 200H locates the second cleaning body 181 at a position, which is radially inside the outer peripheral portion of the wafer W and is shifted toward the moving side of the first cleaning body 171H (here, in the negative Y-axis direction) from the center of the wafer W. This position may be the position of the second cleaning body 181 at the end of the lower surface cleaning processing described above. Thereafter, in a state where the second cleaning body 181 is brought into contact with the lower surface of the wafer W, the controller 200H starts supply of the pure water from the cleaning nozzle 80a to the lower surface of the wafer W and rotates the second cleaning body 181.

Subsequently, the controller 200H controls the swivel unit 81H to swivel the second cleaning body 181 to the outer peripheral portion of the wafer W at a position shifted from the center of the wafer W to the side opposite to the moving side of the first cleaning body 171H (here, the positive-Y axis side). When the second cleaning body 181 reaches the outer peripheral portion of the wafer W, the controller 200H stops the swivel movement of the second cleaning body 181 by the swivel unit 81H and rotates the second cleaning body 181 in that place for a predetermined time.

Further, the controller 200H controls the moving unit 71H so as to dispose the first cleaning body 171H above the center of the wafer W, and ejects a mixed fluid from the first cleaning body 171H to the center of the upper surface of the wafer W. Then, the controller 200H moves the first cleaning body 171H to the outer peripheral portion in the negative Y-axis direction from the center of the wafer W by controlling the moving unit 71H at a timing at least after the second cleaning body 181 moves to a side opposite to the moving side of the first cleaning body 171H (here, the positive Y-axis side) from the center of the wafer W. As a result, it is possible to perform the both-surface cleaning processing without bringing the first cleaning body 171H and the second cleaning body 181 close to each other.

As described above, the substrate processing apparatus 1H according to the ninth embodiment includes a holding unit (e.g., the spin chuck 11), the first cleaning body 171H, a first moving mechanism (e.g., the arm 70H, the moving unit 71H, and the rail 72H), the second cleaning body 181, a second moving mechanism (e.g., the arm 80 and the swivel unit 81H), and the controller 200H. The holding unit holds a substrate (e.g., a wafer W). The first cleaning body 171H cleans one of the upper surface and the lower surface (e.g., the upper surface) of the substrate held by the holding portion by ejecting a fluid (e.g., a mixed fluid) thereto. The first moving mechanism horizontally moves the first cleaning body 171H. The second cleaning body 181 cleans the other one of the upper surface and the lower surface (e.g., the lower surface) of the substrate held by the holding unit by coming into contact therewith. The second moving mechanism horizontally moves the second cleaning body 181. The controller 200H controls the first moving mechanism and the second moving mechanism to perform a both-side cleaning processing in which the first cleaning body 171H, which ejects the fluid to the one surface, and the second cleaning body, which is brought into contact with the lower surface of the first cleaning body 171H, are horizontally moved in synchronization.

Specifically, the controller 200H controls the first driving mechanism and the second driving mechanism to horizontally move the first cleaning body 171H and the second cleaning body 181 in the direction in which the first cleaning body 171H and the second cleaning body 181 are separated away from each other.

Therefore, according to the substrate processing apparatus 1H according to the ninth embodiment, since the wafer W is able to be made less susceptible to the influence of the deflection of the wafer W due to the pressure of the mixed fluid, it is possible to strongly clean the wafer W using the second cleaning body 181.

An example in which the upper surface of the wafer W is cleaned using the first cleaning body 171H, and the lower surface of the wafer W is cleaned using the second cleaning body 181 has been described here. However, the lower surface of the wafer W may be cleaned using the first cleaning unit 17H, and the upper surface of the wafer W may be cleaned using the second cleaning body 181.

In addition, an example in which the first cleaning body 171H is moved to the negative Y-axis side has been described here. However, the moving direction of the first cleaning body 171H is not limited thereto, and may be moved to, for example, the positive Y-axis side. In this case, it is sufficient for the controller 200H to move the second cleaning body 181 from a position shifted to the positive Y-axis side from the center of the wafer W to the outer peripheral portion of the wafer W at a position shifted from the center of the wafer W to the negative Y-axis side.

In addition, an example in which the first cleaning body 171H is a two-fluid nozzle for ejecting a mixed fluid of a gas and a liquid has been described here. However, the first cleaning body 171H does not necessarily need to be a two-fluid fluid nozzle as long as the first cleaning body 171H supplies a fluid to the wafer W.

Modification

In the embodiments described above, after a both-surface cleaning processing is started and until the first cleaning body 171 and the second cleaning body 181 are synchronized, that is, while the first cleaning body 171 is cleaning the central portion of the wafer W, the second cleaning body 181 is stopped. However, the present disclosure is not limited to this, and the lower surface of the wafer W may be cleaned using the second cleaning body 181 while the first cleaning body 171 is cleaning the central portion of the wafer W.

In the embodiments described above, the first cleaning body 171 and the second cleaning body 181 are rotated in the same direction as the wafer W. However, the first cleaning body 171 and the second cleaning body 181 may be rotated in the direction opposite to the rotating direction of the wafer W. In the embodiments described above, the first cleaning body 171 and the second cleaning body 181 are rotated in the same direction. However, the first cleaning body 171 and the second cleaning body 181 may be rotated in opposite directions. The rotation speed of the first cleaning body 171 and the second cleaning body 181 may be the same as the rotation speed of the wafer W, may be lower than the rotation speed of the wafer W, or may be higher than the rotation speed of the wafer W. In addition, the first cleaning body 171 and the second cleaning body 181 do not necessarily need to be rotated.

Further, in the embodiments described above, the first cleaning body 171 and the second cleaning body 181 are linearly moved along the rails 72 and 82. However, for example, the first cleaning body 171 and the second cleaning body 181 may be moved in an arc shape by causing the first cleaning body 171 to be supported on a first pivot arm that pivots around a vertical shaft and causing the second cleaning body 181 to be supported on a second pivot arm that pivots around a vertical axis. In this case, by matching the positions of the pivot centers of the first pivot arm and the second pivot arm, it is possible to synchronize the movements of the first cleaning body 171 and the second cleaning body 181.

In addition, in the embodiments described above, an example of performing a both-surface cleaning processing has been described. However, depending on the type of wafer W, for example, only a lower surface cleaning processing may be performed. In the case where only the lower surface cleaning processing is performed without performing the both-surface cleaning processing, since, for example, pure water is suppressed from being turned around to the upper surface side of the wafer W is suppressed, the rotation speed of the wafer W may be lowered in comparison with the case of performing the both-surface cleaning processing. Alternatively, only the upper surface of the wafer W may be cleaned without performing the both-surface cleaning processing.

Here, the both-surface cleaning processing of the wafer W is not limited to the cleaning of the circuit formation surface and the surface on which no circuit is formed. For example, at least one side of a wafer W may be a member bonded to the circuit formation surface. This case includes, for example, a protective member for protecting the circuit and a bonded wafer in which the wafers are bonded to each other. Further, the wafer may be a wafer W before the circuit is formed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a substrate holder configured to hold a substrate;
a first cleaning body configured to clean one surface of an upper surface and a lower surface of the substrate held by the substrate holder by ejecting fluid thereto or by coming into contact therewith;
a first moving mechanism including a first arm attached to a first rail configured to horizontally move the first cleaning body;
a second cleaning body configured to clean a remaining surface of the upper surface and the lower surface of the substrate held by the substrate holder by coming into contact therewith;
a second moving mechanism including a second arm attached to a second rail configured to horizontally move the second cleaning body;
a housing configured to surround the first moving mechanism and the second moving mechanism; and
a controller configured to control the first moving mechanism and the second moving mechanism to perform a both-surface cleaning processing,
wherein the controller moves the first cleaning body, which ejects the fluid to the one surface or is brought into contact with the one surface, from a position at a center of the substrate to a position overlapping the second cleaning body which is stopped at a position deviated from the center of the substrate, and subsequently moves both the first cleaning body and the second cleaning body which is in contact with the remaining surface of the upper surface and the lower surface of the substrate, horizontally in synchronization with each other toward an outer peripheral portion of the substrate, wherein the first rail and the second rail are both positioned at a bottom of the housing.

2. The substrate processing apparatus of claim 1, wherein the first cleaning body cleans the one surface by ejecting the fluid thereto, and in the both-surface cleaning processing, the controller controls the first moving mechanism and the second moving mechanism to horizontally move the first cleaning body and the second cleaning body in a direction where the first cleaning body and the second cleaning body are separated away from each other.

3. The substrate processing apparatus of claim 2, wherein the substrate holder includes:

a rotatable first substrate holder configured to suck and hold a first area including a central portion of the lower surface of the substrate; and a second substrate holder configured to suck and hold a second area which is an area other than the first area on the lower surface of the substrate, and wherein the controller is configured to control the second moving mechanism in a state where the substrate is sucked and held by the second substrate holder so as to execute the both-surface cleaning processing by bringing the second cleaning body into contact with the second area in a state where the substrate is sucked, held, and rotated by the first substrate holder after a lower surface cleaning processing is executed in which the second cleaning body is brought into contact with the first area and the first area is horizontally moved.

4. The substrate processing apparatus of claim 1, wherein the first cleaning body cleans the upper surface of the substrate by coming into contact therewith, and the second cleaning body cleans the lower surface of the substrate by coming into contact therewith.

5. The substrate processing apparatus of claim 4, wherein the controller is configured to execute a processing of horizontally moving the first cleaning body and the second cleaning body while maintaining a state where a contact surface of the first cleaning body with the upper surface and a contact surface of the second cleaning body with the lower surface overlap each other when the substrate held by the substrate holder is viewed in a thickness direction in a plan view, as the both-surface cleaning processing.

6. The substrate processing apparatus of claim 4, further comprising:

a first driver configured to rotate the first cleaning body around a vertical axis; and a second driver configured to rotate the second cleaning body around a vertical axis, wherein the controller is configured to execute a processing of horizontally moving the first cleaning body and the second cleaning body in a state where a center of rotation of the first cleaning body by the first driver and a center of rotation of the second cleaning body by the second driver are made to coincide with each other, as the both-surface cleaning processing.

7. The substrate processing apparatus of claim 4, wherein the first moving mechanism is configured to move the first cleaning body up and down, the second moving mechanism is configured to move the second cleaning body up and down, and the controller is configured to control at least one of the first moving mechanism and the second moving mechanism such that a pressing force of the first cleaning body against the upper surface and a pressing force of the second cleaning body against the lower surface have a same magnitude in the both-surface cleaning processing.

8. The substrate processing apparatus of claim 7, further comprising:

a load detector configured to detect the pressing force of the first cleaning body against the upper surface or the pressing force of the second cleaning body against the lower surface, wherein the controller is configured to arrange one of the first cleaning body and the second cleaning body at a predetermined height position, and to adjust a height position of a remaining one of the first cleaning body and the second cleaning body based on a detection result.

9. The substrate processing apparatus of claim 4, wherein one of the upper surface and the lower surface is a circuit forming surface, and a contact surface with the substrate in one cleaning body, which comes into contact with the circuit forming surface, among the first cleaning body and the second cleaning body is larger than a contact surface with the substrate in a remaining cleaning body.

10. The substrate processing apparatus of claim 4, wherein one of the upper surface and the lower surface is a circuit forming surface, and of the first cleaning body and the second cleaning body, one cleaning body, which comes into contact with the circuit forming surface, is softer than a remaining cleaning body.

11. The substrate processing apparatus of claim 4, wherein the substrate holder includes:

a rotatable first substrate holder configured to suck and hold a first area including a central portion of the lower surface of the substrate; and a second substrate holder configured to suck and hold a second area which is an area other than the first area on the lower surface of the substrate, and wherein the controller is configured to control the second moving mechanism in a state where the substrate is sucked and held by the second substrate holder so as to execute the both-surface cleaning processing by bringing the second cleaning body into contact with the second area in a state where the substrate is sucked, held, and rotated by the first substrate holder after a lower surface cleaning processing is executed in which the second cleaning body is brought into contact with the first area and the first area is horizontally moved.

12. A substrate processing method comprising:

holding a substrate by a substrate holder; and cleaning both an upper surface and a lower surface of the substrate by horizontally moving a first cleaning body, via a first arm and a first rail, from a position at a center of the substrate to a position overlapping a second cleaning body, which is stopped at a position deviated from the center of the substrate, and subsequently moving both the first cleaning body and the second cleaning body, the second cleaning body being moved via a second arm and a second rail, horizontally in synchronization with each other toward an outer peripheral portion of the substrate, wherein the first cleaning body, configured to clean one surface of an upper surface and a lower surface of the substrate by ejecting a fluid there to or by coming into contact therewith, is caused to eject the fluid to the one surface or brought into contact with the one surface, and the second cleaning body, configured to clean a remaining surface of the upper surface and the lower surface of the substrate by coming into contact therewith, is brought into contact with the remaining surface, and wherein the first rail and the second rail are both positioned at a bottom of a housing.

* * * * *